(12) United States Patent
Rosen

(10) Patent No.: US 9,106,233 B1
(45) Date of Patent: Aug. 11, 2015

(54) METHOD AND APPARATUS FOR SYNCHRONIZATION

(71) Applicant: Marvell Israel (M.I.S.L) Ltd., Yokneam (IL)

(72) Inventor: Eitan Rosen, Abirim (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 215 days.

(21) Appl. No.: 13/778,925

(22) Filed: Feb. 27, 2013

Related U.S. Application Data

(63) Continuation-in-part of application No. 13/735,686, filed on Jan. 7, 2013, which is a continuation-in-part of application No. 12/707,142, filed on Feb. 17, 2010, now Pat. No. 8,354,857.

(60) Provisional application No. 61/604,285, filed on Feb. 28, 2012, provisional application No. 61/604,294, filed on Feb. 28, 2012, provisional application No. 61/155,323, filed on Feb. 25, 2009.

(51) Int. Cl.
| | |
|---|---|
| *H03L 7/00* | (2006.01) |
| *H04B 3/23* | (2006.01) |
| *H04B 1/02* | (2006.01) |
| *H04L 7/10* | (2006.01) |

(52) U.S. Cl.
CPC ... *H03L 7/00* (2013.01); *H04B 1/02* (2013.01); *H04B 3/23* (2013.01); *H04L 7/10* (2013.01)

(58) Field of Classification Search
CPC ............ H04B 3/23; H04B 3/234; H04B 1/02; H04B 1/06; H04B 1/38; H04L 7/0008; H04L 7/10; H04L 12/403; H04L 12/413
USPC ......... 327/291, 298, 299; 331/57; 326/93, 96, 326/98
See application file for complete search history.

(56) References Cited

U.S. PATENT DOCUMENTS

| | | | |
|---|---|---|---|
| 5,818,250 A | 10/1998 | Yeung et al. | |
| 6,657,504 B1 | 12/2003 | Deal et al. | |
| 6,668,346 B1 | 12/2003 | Schulz et al. | |
| 6,853,177 B2 | 2/2005 | Shibayama et al. | |
| 6,933,739 B1 | 8/2005 | Rosen | |
| 7,348,857 B1 | 3/2008 | Ecker et al. | |
| 2004/0108866 A1 | 6/2004 | Burns et al. | |
| 2007/0103221 A1* | 5/2007 | Ogita | 327/291 |
| 2010/0046956 A1* | 2/2010 | Uno et al. | 398/139 |

OTHER PUBLICATIONS

Franch, R., et al., "On-chip Timing Uncertainty Measurements on IBM Microprocessors," IEEE International Test Conference, pp. 1-7, 2007.

(Continued)

*Primary Examiner* — John Poos

(57) ABSTRACT

Aspects of the disclosure provide a circuit that includes a clock synchronization circuit. The clock synchronization circuit is configured to determine a sub-cycle offset between a first clock signal and a second clock signal, and select rising/falling edges of the first clock signal and the second clock signal based on the sub-cycle offset for enabling communication between a first clock domain that is operative in response to the first clock signal and a second clock domain that is operative in response to the second clock signal.

17 Claims, 15 Drawing Sheets

(56) References Cited

OTHER PUBLICATIONS

Altera Corporation, The Programmable Solutions Company, Extended Temperature Support for Cyclone Devices, San Jose, CA Jul. 2004, ver 1.1.

B. Gill et al., IEEE, An Efficient BICS Design for SEUs Detection and Correction in Semiconductor Memories, 2005.

Zaryab Hamavand, National Semiconductor Corporation, Analog Edge, Temperature Sensor Solutions for Low-Voltage Systems, 2005.

Maxim-ic.com, Dallas Semiconductor, How Delay Lines Work, App Note 209.

EDACafe.com, Tower Semiconductor adopts Legend's CharFlo-Memory! For quality assurance of commercially available memory compliers., Santa Clara, CA Dec. 15, 2003.

* cited by examiner

METHOD AND APPARATUS FOR SYNCHRONIZATION

INCORPORATION BY REFERENCE

This application claims the benefit of U.S. Provisional Applications No. 61/604,285, "An Agile Clock Generator for Gals Modules" filed on Feb. 28, 2012, and No. 61/604,294, "Clock to Clock Synchronizer Module" filed on Feb. 28, 2012, and is a Continuation-in-part of U.S. patent application Ser. No. 13/735,686, "Method and Apparatus for Clock Generator" filed on Jan. 8, 2013, which in turn is a Continuation-in-part of U.S. patent application Ser. No. 12/707,142, "Method and Apparatus for Speed Monitoring" filed on Feb. 17, 2010, which in turn claims the benefit of U.S. Provisional Application No. 61/155,323, "Inversion Counter for Speed Monitoring" filed on Feb. 25, 2009. The entire disclosures of the prior applications are incorporated by reference herein in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a globally asynchronous locally synchronous (GALS) system includes multiple subsystems. Circuits in each subsystem operate in a synchronous manner, however circuits in the different subsystems do not necessarily need to operate in the synchronous manner, although signals may need to be transmitted from one subsystem to another.

SUMMARY

Aspects of the disclosure provide a circuit that includes a clock synchronization circuit. The clock synchronization circuit is configured to determine a sub-cycle offset between a first clock signal and a second clock signal, and select rising/failing edges of the first clock signal and the second clock signal based on the sub-cycle offset for enabling communication between a first clock domain that is operative in response to the first clock signal and a second clock domain that is operative in response to the second clock signal.

In an embodiment, the clock synchronization circuit includes a sub-cycle offset determination circuit and a clock control circuit. The sub-cycle offset determination circuit is configured to determine an offset in a cycle between the first clock signal and the second clock signal as a number of delay units. The clock control circuit is configured to select the edges of the first clock signal and the second clock signal based on the determined offset.

In an example, the sub-cycle offset determination circuit is configured to determine a first number of delay units corresponding to a first clock cycle of the first clock signal, a second number of delay units corresponding to a second clock cycle of the second clock signal, and a third number of delay units corresponding to the offset in a cycle between the first clock signal and the second clock signal.

In an embodiment, the sub-cycle offset determination circuit includes an inversion counter configured to determine a number of inversion delays in a time duration. In an example, the inversion counter includes a ring oscillator and a controller. The ring oscillator is configured to propagate a signal through a plurality of inversion stages that forms the ring oscillator. The controller is configured to determine the number of inversion stages that the signal propagates in the time duration. Further, in an example, the ring oscillator is locked to one of the first clock signal and the second clock signal to propagate a pre-determined number of inversion stages during a clock cycle.

Further, according to an aspect of the disclosure, the circuit includes a transmitting circuit and a receiving circuit. The transmitting circuit is configured to transmit a signal from the first clock domain to the second clock domain according a first interface clock generated based on the first clock signal. The receiving circuit is configured to sample the signal transmitted from the first clock domain according a second interface clock generated based on the second clock signal.

Aspects of the disclosure provide a method. The method includes determining a sub-cycle offset between a first clock signal and a second clock signal, and selecting rising/failing edges of the first clock signal and the second clock signal based on the sub-cycle offset for enabling communication between a first clock domain that is synchronized based on the first clock signal and a second clock domain that is synchronized based on the second clock signal. In an example, the first clock signal and the second clock signal are not synchronized.

Aspects of the disclosure also provide a system. The system includes a first subsystem, a second subsystem and a clock synchronization circuit. The first subsystem is configured to be operative in response to a first clock signal. The second subsystem is configured to be operative in response to a second clock signal. The clock synchronization circuit is configured to determine a sub-cycle offset between the first clock signal and the second clock signal, and select rising/failing edges of the first clock signal and the second clock signal based on the sub-cycle offset for enabling communication between the first subsystem and the second subsystem. In an example, the first clock signal and the second clock signal are not synchronized, and the system is a globally asynchronous locally synchronous (GALS) system.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
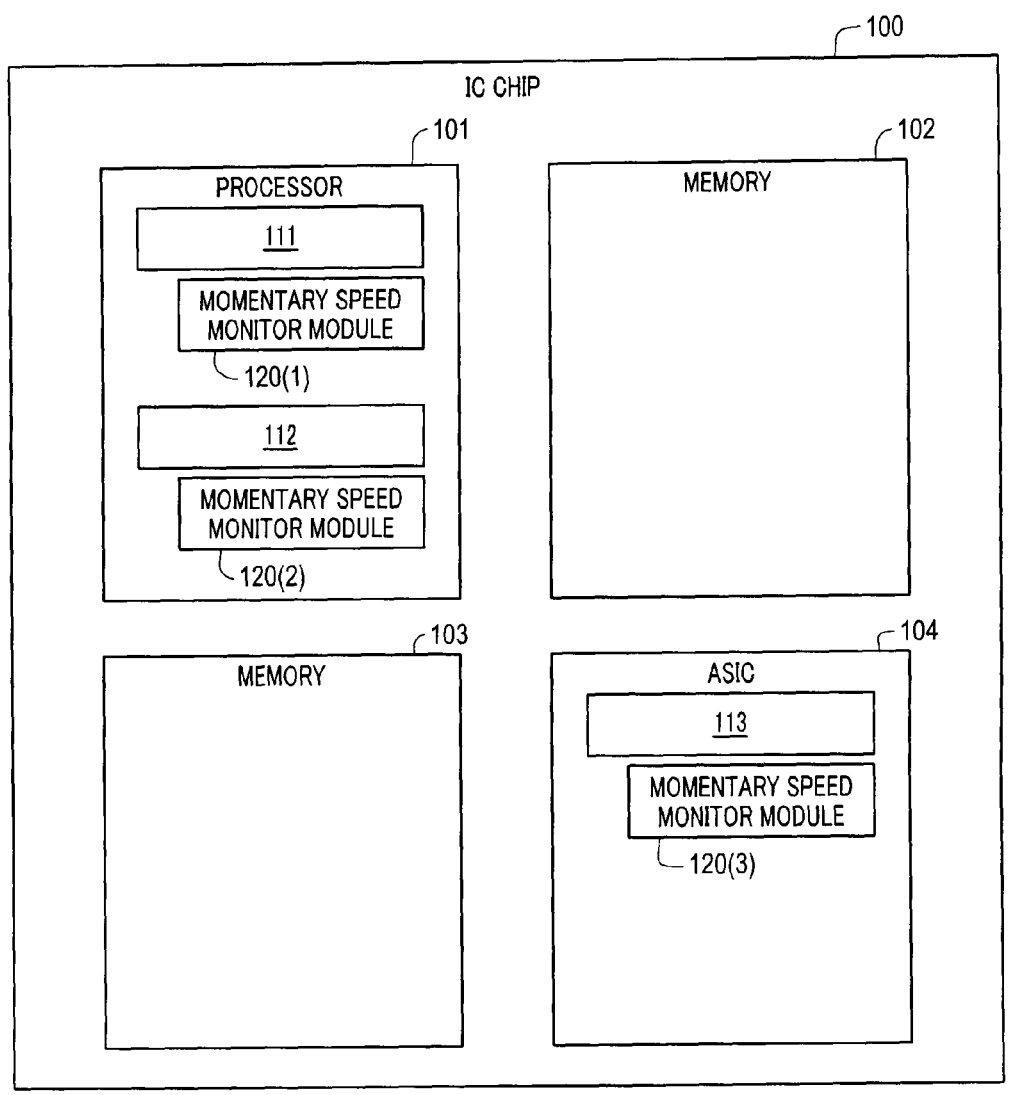
FIG. 1 shows a block diagram of an integrated circuit (IC) chip example 100 according to an embodiment of the disclosure.

FIG. 1 shows a block diagram of an integrated circuit (IC) chip example 100 according to an embodiment of the disclosure. The IC chip 100 includes various operational modules 101-104, such as a processor module 101, memory module 102-103, an application specific integrated circuit (ASIC) module 104, and the like. It is noted that different modules and different quantities of circuit modules are suitably found in IC chips. In addition, the IC chip 100 includes momentary speed monitor modules 120(1-3) for monitoring circuit speed. The momentary speed monitor modules 120(1-3) are suitably distributed in the IC chip 100 at locations of interest. In accordance with an embodiment, at least one momentary speed monitor module 120 is associated with one of the operational modules 101-104 to monitor a speed of its associated operational module, and detect speed variations of the associated operational module. Such variations in speed are the result of process, temperature and/or voltage variations, which in some applications are localized.

In an embodiment, the IC chip 100 includes critical circuits 111-113, such as critical paths, and the like, that have a relatively higher possibility of failure. The momentary speed monitor modules 120(1-3) are suitably distributed in neighborhoods of the critical circuits 111-113. In addition, in an embodiment, a momentary speed monitor module 120 is suitably coupled to a selected critical circuit. For example, the momentary speed monitor module 120(1) receives a clock signal from a same branch of a clock tree as the critical circuit 111. In another example, a power supply of the momentary speed monitor module 120(1) travels a substantially same power supply path as a power supply of the critical circuit 111.

In accordance with an embodiment, the critical circuits 111-113 are determined by any suitable mechanism. In addition, the critical circuits 111-113 can be determined from various aspects, such as a relatively small margin for operation, a relatively higher sensitivity to an environmental parameter, and the like. Thus, the critical circuits 111-113 have a relatively higher possibility of failing with respect to changes of environmental parameters.

In an example, the critical circuit 111 includes a critical path. The critical path is a signal propagating path in a combinational logic that has a relatively large delay value. The relatively large delay value can be close to a clock cycle, thus the critical path has a relatively strict delay margin. The momentary speed monitor module 120(1) is placed in a neighborhood of the critical circuit 111 to monitor a speed variation in the neighborhood. In another example, the critical circuit 112 is sensitive to a voltage supply variation. The momentary speed monitor module 120(2) is placed in a neighborhood of the critical circuit 112 and is suitably coupled to the critical circuit 112 to detect the voltage supply variation by suitably detecting the speed variation. In another example, the critical circuit 113 is sensitive to a temperature variation. The momentary speed monitor module 120(3) is placed in a neighborhood of the critical circuit 113 to detect the temperature variation by suitably detecting the speed variation.

In another embodiment, a momentary speed monitor module 120 is used for localized speed monitoring. When the momentary speed monitor module 120 detects a relatively slow speed at a location, an operational module at the location can have delay faults due to the relatively slow speed. In an example, the operational module is suitably configured, such as by increasing the supply voltage, and the like, to increase the speed. When the momentary speed monitor module 120 detects a relatively fast speed at the location, the operational module at the location can suffer from a localized heat-up. In an example, the operational module is suitably configured, such as reducing the supply voltage, and the like, to reduce the speed.

According to an embodiment of the disclosure, a momentary speed monitor module 120 includes a ring oscillator and additional circuitry coupled to the ring oscillator to enable momentary speed monitoring. The momentary speed monitor module 120 is configured to detect a target signal transition edge at a stage of the ring oscillator, and to determine a speed of the ring oscillator based on the detected target signal transition edge and edges of a clock signal. In an example, the ring oscillator is enabled to start oscillating in response to a first rising edge of the clock signal. When the target signal transition edge at the stage of the ring oscillator is detected, the momentary speed monitor module 120 determines the speed of the ring oscillator based on a timing of the target signal transition edge, and a timing of a second rising edge of the clock signal. For example, when the target signal transition edge is ahead of the second rising edge of the clock signal, the momentary speed monitor module 120 determines that the speed of the ring oscillator is fast enough for the target signal transition edge to incur before the second rising edge of the clock signal; and when the target signal transition edge follows the second rising edge of the clock signal, the momentary speed monitor module 120 determines that the speed of the ring oscillator is not fast enough for the target signal transition edge to incur before the second rising edge of the clock signal.

It is noted that the target signal transition edge at the stage of the ring oscillator can be any signal transition edge at the stage, such as a first rising edge, a first falling edge, a second rising edge, a second falling edge, and the like.

In addition, the target signal transition edge can be suitably chosen for various speed monitoring purposes. In an example, the target signal transition edge is chosen to correspond to a lower speed boundary of an operational module. For example, a time (a delay) of the target signal transition edge to the first rising edge of the clock signal corresponds to a delay of a critical path of the operational module. Thus, when the target signal transition edge follows the second rising edge of the clock signal, for example, the critical path can have a delay error. In another example, the target signal transition edge is chosen to correspond to an upper speed boundary. Thus, when the target signal transition edge is ahead of the second rising edge of the clock signal, the speed of the operational module is too fast, and may cause local heat-up.

In an embodiment, a momentary speed monitor module 120, such as the momentary speed monitor module 120(1), and the like, detects a speed in a momentary manner. In an example, the first rising edge and the second rising edge of the clock signal are successive rising edges. Thus, the momentary speed monitor module 120 monitors a delay error in a single clock cycle, such as in 1 ns for 1 GHz clock frequency.

Accordingly, in an embodiment, the speed monitoring module can be employed as a momentary speed monitor module to detect speed variations caused by momentary variations. In an example, a leakage path from a power supply to ground in a circuit is input pattern dependent. When the leakage path is activated by an input pattern, the leakage causes a voltage drop in the voltage supply. The voltage drop can happen in a first clock cycle, and may or may not happen in next clock cycles. The voltage drop in the first clock cycle increases delays, and may cause delay errors in the first clock cycle. However, delays in the next clock cycles may be normal.

In another example, current consumption in a circuit changes from clock cycle to clock cycle depending on activities, such as switching activities, in the circuit during each clock cycle. Further, the voltage supply may or may not drop in a clock cycle due to the current consumption in the cycle.

The momentary speed monitor module 120 can be suitably configured, for example, by choosing the stage, the target signal transition edge, and the like, to detect a voltage drop in a clock cycle. For example, the stage and the target signal transition edge are suitably chosen, such that when the supply voltage is normal, the target signal transition edge is ahead of the second rising edge of the clock signal, and when a voltage drop happens, the target signal transition edge follows the second rising edge of the clock signal. Thus, when a voltage drop happens in the first clock cycle, the momentary speed monitor module 120 detects a delay error at the end clock cycle.

In a related speed monitor example, a speed of a circuit is monitored based on a frequency measurement of a ring oscillator. Generally, the frequency of the ring oscillator is measured over a time duration, such as 1 μs. Thus, a voltage drop in a single clock cycle may not significantly change the frequency of the ring oscillator over the time duration. Therefore, the ring oscillator frequency based speed monitoring may not detect the voltage drop in the single clock cycle.

According to another aspect of the disclosure, a momentary speed monitor module 120 consumes a relatively small silicon area. More specifically, the momentary speed monitor module 120 detects a delay error based on a target signal transition edge at a single stage of a ring oscillator. The ring oscillator can use a relatively small number of inverters to generate a delay of a relatively large number of inversions. In addition, the momentary speed monitor module 120 does not need a large number of edge capture circuits to capture signal transition edges at a large number of stages. Thus, the momentary speed monitor module 120 consumes a relatively small silicon area. In an implementation example, a momentary speed monitor module 120 consumes 30 gm by 20 μM in a 65 nm technology. In another implementation example, a momentary speed monitor module 120 consumes 14 μm by 4.8 μm in a 28 nm technology.

Further, according to an embodiment, a momentary speed monitor module 120 can be software configurable. In an example, the momentary speed monitor module 120 receives a control vector. In an embodiment, the control vector indicates a number of inversions corresponding to a speed specification, such as a lower speed boundary, an upper speed boundary, and the like. Based on the control vector, the momentary speed monitor module 120 selects a stage of the ring oscillator by sending a selection signal to a multiplexer, for example. Further, based on the control vector, the momentary speed monitor module 120 counts a number of transitions at the stage to detect the target signal transition edge.

Figure 2:
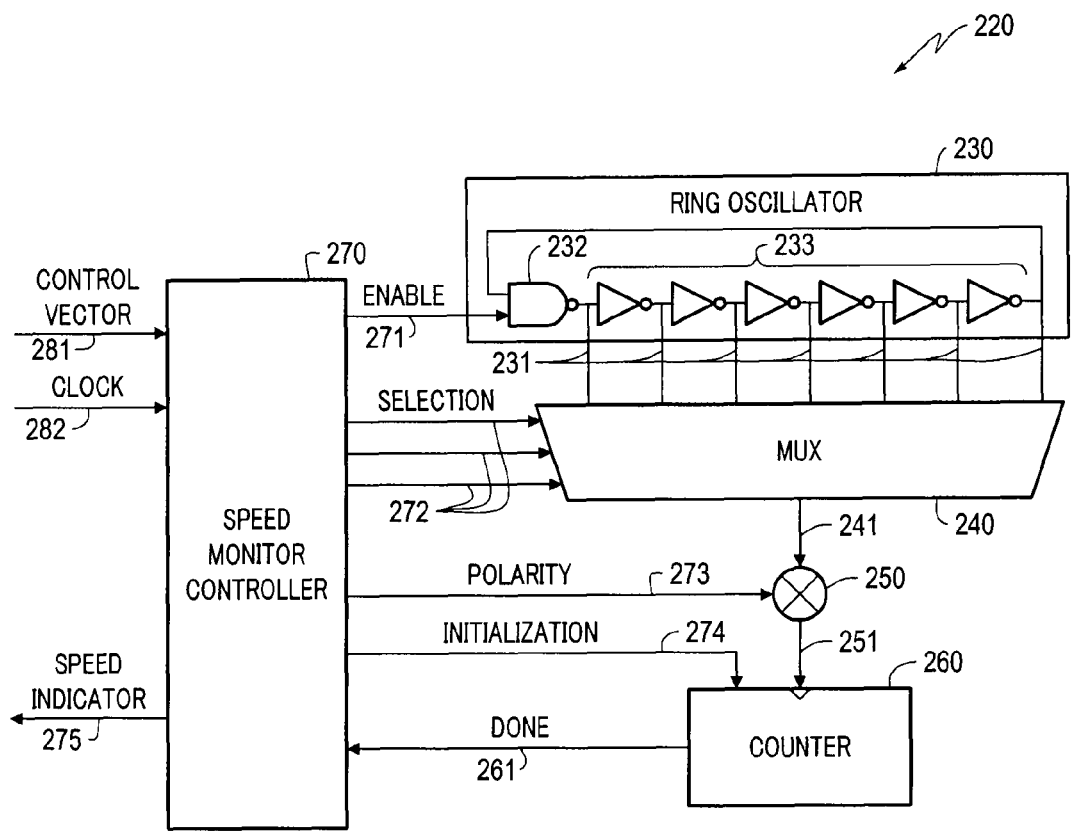
FIG. 2 shows the block diagram of a counter based momentary speed monitor module example 220 according to an embodiment of the disclosure.

FIG. 2 shows a counter based momentary speed monitor module example 220 according to an embodiment of the disclosure. The counter based momentary speed monitor module 220 includes a ring oscillator module 230, a multiplexer module 240, an XOR module 250, a counter module 260, and a speed monitor controller module 270. These elements can be coupled together as shown in FIG. 2.

The ring oscillator module 230 includes an N-stage ring oscillator. The ring oscillator module 230 receives an enable signal 271 from the speed monitor controller module 270, and outputs a plurality of stage signals 231. In an example, each stage outputs a stage signal 231. The enable signal 271 enables or disables the N-stage ring oscillator. In the FIG. 2 example, the ring oscillator module 230 includes a seven-stage ring oscillator. The seven-stage ring oscillator includes a NAND gate 232 and six inverters 233 formed in a ring. When the enable signal 271 is logic "0", the seven-stage ring oscillator stops oscillating. When the enable signal 271 is logic "1", the seven-stage ring oscillator starts oscillating. Each stage provides a stage signal 231. The stage signals 231 are provided to the multiplexer module 240.

The multiplexer module 240 receives the plurality of stage signals 231 from the ring oscillator module 230, and a selection signal 272 from the speed monitor controller module 270. The selection signal 272 indicates which of the stage signals 231 is to be selected by the multiplexer module 240. Based on the selection signal 272, the multiplexer module 240 selects one of the stage signals 231. In the FIG. 2 example, the multiplexer module 240 receives seven stage signals 231 from the ring oscillator module 230, and receives a 3-bit selection signal 272, indicated by three arrows 272 from the speed monitor controller 270. Based on the 3-bit selection signal 272, the multiplexer module 240 selectively outputs one of the stage signals 231 as a selected stage signal 241.

The XOR module 250 receives the selected stage signal 241 and a polarity signal 273 from the speed monitor controller module 270, executes a XOR operation of the selected stage signal 241 and the polarity signal 273 to generate a counter trigger signal 251, and provides the counter trigger signal 251 to the counter module 260. The polarity signal 273 is provided by the speed monitor controller module 270 to suitably adjust a transition direction of a target signal transition edge with regard to the counter module 260. In an example, the counter module 260 is rising edge triggered. When the target signal transition edge at a stage of the ring oscillator module 230 is a rising edge, the speed monitor controller module 270 provides "0" as the polarity signal 273. However, when the target signal transition edge is a falling edge, the speed monitor controller module 270 provides "1" as the polarity signal 273. It is noted that when the counter module 260 is falling-edge triggered, the polarity signal 273 can be suitably adjusted to change the transition direction of the target signal transition edge to be falling edge.

It is noted that, in an example, the XOR module 250 can be removed, and the polarity selection is implemented by other suitably technique. For example, a multiplexer is used at the input of the ring oscillator 230 to make the first transition either a rise transition or a fall transition based on a polarity signal, such as the polarity signal 273.

The counter module 260 counts transitions (rising edges or falling edges) in the counter trigger signal 251, detects the target signal transition edge, and provides a done signal 261 to the speed monitor controller module 270 based on the detection. In an example, the counter module 260 includes a rising edge counter, and the target signal transition edge is a third rising edge, such as a third rising edge at the first stage of the ring oscillator module 230 for monitoring a speed of 36 inversions. The counter module 260 outputs logic "0" as the done signal 261 before receiving three rising edges, and sets the done signal 261 to logic "1" when three rising edges are received.

In another example, the counter module 260 is configured to set the done signal 261 to logic "1" when the rising edge counter overflows. Supposing the rising edge counter is a 4-bit counter, the rising edge counter can be initialized to "1101". Thus, when the rising edge counter counts three rising edges, the rising edge counter overflows, and the counter module 260 sets the done signal 261, e.g. "1". In an embodiment, the speed monitor controller 270 provides an initialization signal 274 to the counter module 260. Based on the initialization signal 274, the counter module 260 initializes the rising edge counter.

The speed monitor controller 270 receives a control vector 281, a clock signal 282. Based on the control vector 281, the speed monitor controller 270 provides the selection signal 272 to the multiplexer module 240, the polarity signal 273 to the XOR module 250, and the initialization signal 274 to the counter module 260. The selection signal 272 is provided to the multiplexer module 240 to select one of the stage signals 231. The polarity signal 273 is provided to the XOR module 250 to suitably adjust the transition direction of the selected stage signal 241. The initialization signal 274 initializes the counter module 260 to a suitable initialization number. Then, based on the clock signal 282, the speed monitor controller module 270 provides the enable signal 271 to the ring oscillator module 230 to start oscillation. The speed monitor controller module 270 receives the done signal 261 when the target signal transition edge is detected. Based on the done signal 261 and the clock signal 282, the speed monitor controller 270 provides a speed indicator signal 275. The speed monitor controller 270 includes any suitable logic to compare timings of the done signal 261 and the clock signal 282, and generate the speed indicator signal 275. In an example, the speed monitor controller 270 includes a sampling circuit that samples the done signal 261 based on the clock signal 282. Based on the sampled done signal 261, the speed monitor controller 270 generates the speed indicator signal 275. In an embodiment, the speed indicator signal 275 indicates whether there is a delay error.

During operation, for example, the speed monitor controller module 270 receives a control vector 281. The control vector 281 is indicative of a target delay to monitor in the form of a number of inversions, for example. Based on the number of the inversions to monitor, the speed monitor controller module 270, determines the selection signal 272, the polarity signal 273, and the initialization signal 274. In an example, the number of inversions is twenty-one. Accordingly, the speed monitor controller module 270 provides "111" as the selection signal 272 to select the seventh stage of the seven-stage ring oscillator. Further, due to the reason the twenty-first inversion is a falling edge, the delay monitor control module 270 provides "1" as the polarity signal 273. In addition, the delay monitor control module 270 provides "1110" to the counter module 260 to initialize the 4-bit rising edge counter, due to the reason the twenty-first inversion is the second falling edge at the seventh stage.

Further, the speed monitor controller module 270 sets the enable signal 271 in response to a first rising edge in the clock signal 282 to enable the ring oscillator module 230 to oscillate. The multiplexer module 240 selects the seventh stage signal as the selected stage signal 241. The XOR module 250 suitably adjusts the transition direction of the counter trigger signal 251. The counter module 260 counts in response to rising edges in the counter trigger signal 251, for example. Thus, when the seventh stage signal has a first falling edge, the counter trigger signal 251 has a first rising edge. The first rising edge triggers the counter module 260 to count one more, and the counter module 260 becomes "1111". When the seventh stage signal has a second falling edge, the counter trigger signal 251 has a second rising edge. The second rising edge triggers the counter module 260 to count one more, and causes the counter module 260 to overflow. Upon overflow of the counter module 260, the counter module 260 sets the done signal 261 to logic "1".

When the speed monitor controller module 270 receives "1" in the done signal 261, the speed monitor controller module 270 compares a timing of the done signal 261 with a second rising edge of the clock signal 282. When the done signal 261 follows the second rising edge of the clock signal 282, the speed monitor controller module 270 sets the speed indicator signal 275 to "1" to indicate a detected delay error.

In an example, the speed monitor controller module 270 includes a sampling circuit that samples the done signal 261 at the second rising edge of the clock signal 282. When the sampled done signal 261 is "0", the speed monitor controller module 270 determines that the done signal 261 follows the second rising edge of the clock signal 282, and outputs logic "1" in the speed indictor signal 275 to indicate that the target delay (in the term of the number of inversions) is longer than a clock cycle, for example. When the sampled done signal 261 is "1", the speed monitor controller module 270 determines that the done signal 261 is ahead of the second rising edge of the clock signal 282, and outputs logic "0" in the speed indictor signal 275 to indicate that the target delay (in the term of the number of inversions) is shorter than a clock cycle, for example. It is noted that the speed monitor controller module 270 can use any other suitable technique to compare the timings of the done signal 261 and the second rising edge of the clock signal 282.

It is noted that various changes can be made to the counter based momentary speed monitor module 220. In an example, the counter module 260 is falling edge triggered. In another example, the speed monitor controller module 270 operates based on falling edges of the clock signal 282. In another example, the NAND gate 232 is suitably configured to have a relatively shorter delay, such as a half delay of a normal inversion, in response to the enable signal 271. Such configuration improves a delay monitoring resolution in the order of a half-inversion.

It is also noted that the first rising edge and the second rising edge can be successive rising edges or can be non-successive rising edges.

It is also noted that the counter based speed monitor module 220 can be simplified. In an example, the counter based speed monitor module 220 is placed in a neighborhood of a critical path. The critical path has a delay that can be suitably determined during design. Thus, the counter based speed monitor module 220 can be suitably configured during design. For example, the stage signal is selected during design, thus the multiplexer module 240 is not needed.

It is also noted that the ring oscillator module 230, the multiplexer module 240, the XOR module 250, and the counter module 260 form an inversion counter that counters inversions propagated in the ring oscillator module 230 up to a target number. The target number is programmable and can be programmed by defining the selection signal 272, the polarity signal 273 and the initialization signal 274. In addition, the inversion counter has a high resolution, such as a resolution of single inversion, or a resolution of half inversion.

Figure 3:
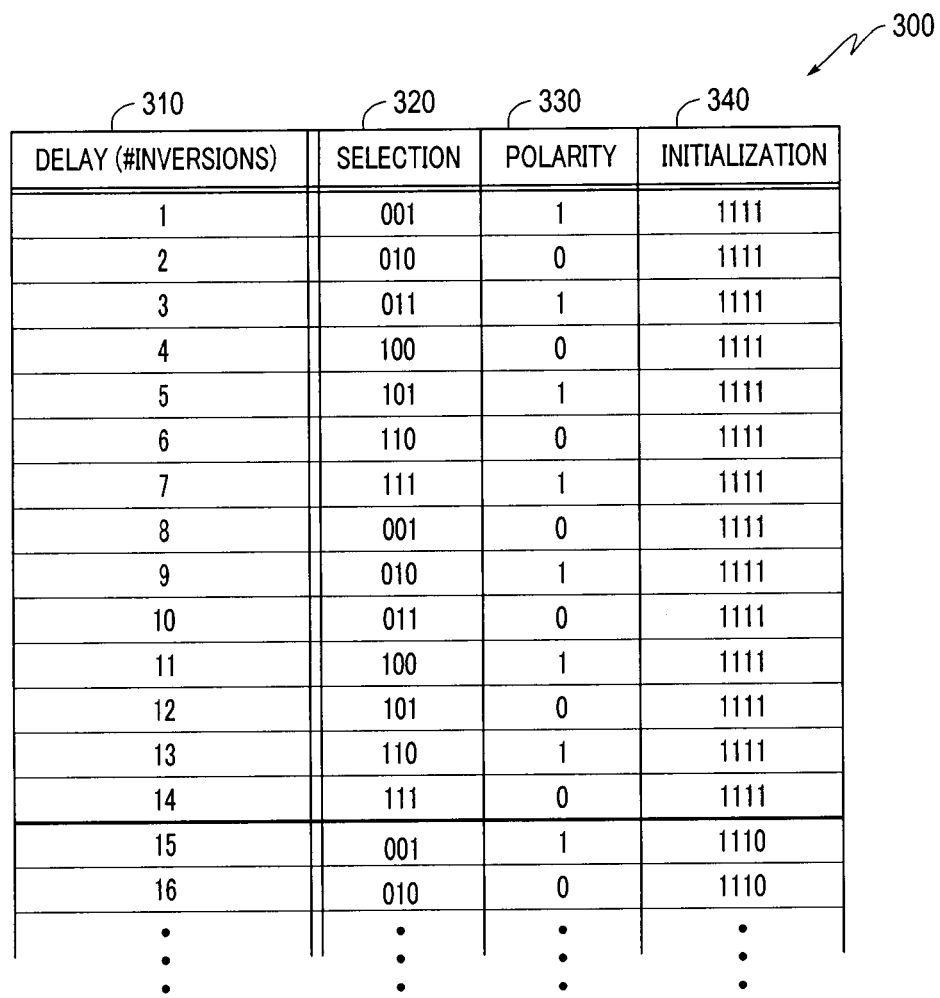
FIG. 3 shows a table 300 of control signal examples according to an embodiment of the disclosure.

FIG. 3 shows a table 300 of control signal examples provided by the speed monitor controller 270 according to an embodiment of the disclosure. The table 300 includes a delay field 310, a selection signal field 320, a polarity signal field 330, and an initialization signal field 340. The delay field 310 indicates a delay value in the form of a number of inversions. The selection signal field 320 includes a three-bit binary value for configuring the multiplexer module 240 to select a stage signal. The polarity signal field 330 includes a one-bit binary value to configure the XOR module 250 to suitably adjust transition direction with regard to the counter module 260. The initialization signal field 340 includes a four-bit binary value for initializing the counter module 260.

Figure 4:
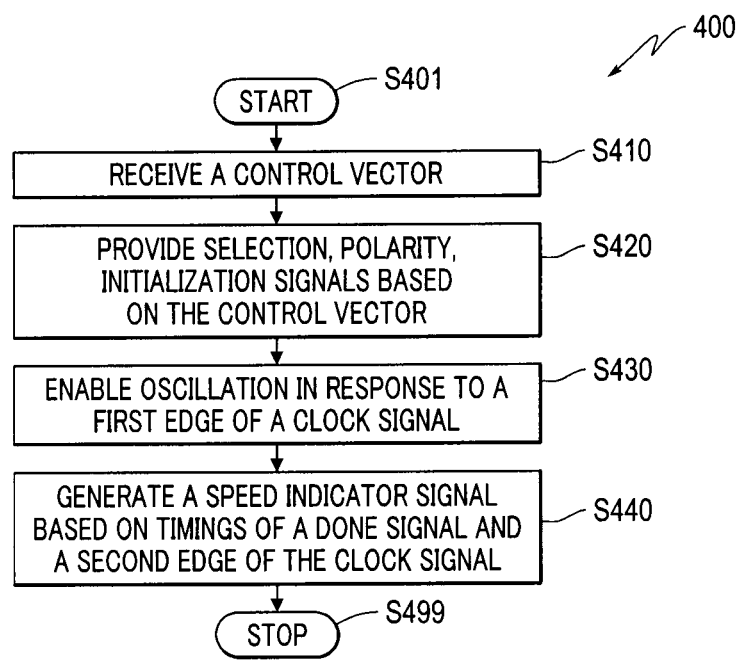
FIG. 4 shows a flowchart outlining a process example 400 for a speed monitor controller example to generate a speed indicator signal according to an embodiment of the disclosure.

FIG. 4 shows a flowchart outlining a process example 400 for the speed monitor controller module 270 to monitor a delay according to an embodiment of the disclosure. The process starts at S401, and proceeds to S410.

At S410, the speed monitor controller module 270 receives a control vector. The control vector can be provided by a higher level controller, such as a test controller, a speed controller, and the like. In an example, the test controller is within a tester that applies various tests on an IC chip having the counter based momentary speed monitor module 220. In another example, the test controller is a build-in self-test controller within a same chip as the counter based momentary speed monitor module 220.

In an embodiment, the control vector includes a mode field and a delay field. The mode field indicates an appropriate mode, such as an idle mode, monitoring mode, and the like, for configuring the counter based momentary speed monitor module 220. The delay field indicates a delay value for monitoring, such as in the form of a number of inversions.

At S420, the speed monitor controller module 270 provides the selection signal 272 to the multiplexer module 240, the polarity signal 273 to the XOR module 250, and initialization signal 274 to the counter module 260 based on the number of inversions for monitoring. In an example, the speed monitor controller module 270 determines a stage of the ring oscillator module 230 for monitoring, and a target edge at the stage corresponding to the number of inversions. Based on the stage, the speed monitor controller module 270 determines the selection signal 272. Based on the target edge and the counter module 260, the speed monitor controller module 270 determines the polarity signal 273. Further, based on the target edge, the speed monitor controller module 270 determines the initialization signal 274.

In another example, the speed monitor controller module 270 includes the table 300. Based on the table 300, the speed monitor controller module 270 determines the selection signal 272, the polarity signal 273, and initialization signal 274 based on the number of inversions for monitoring. It is noted that the speed monitor controller module 270 can use any other suitable technique, such as logic calculation, and the like, to determine the selection signal 272, the polarity signal 273, and initialization signal 274.

At S430, the speed monitor controller module 270 enables the ring oscillator module 230 to start oscillating in response to a first edge, such as a first rising edge of the clock signal 282. More specifically, in an embodiment, the speed monitor controller module 270 sets the enable signal 271 to logic "1" in response to the first rising of the clock signal 282. The enable signal 271 enables the ring oscillator module 230 to start oscillating. The multiplexer module 240 selects one of the stage signals 231. The XOR module 250 adjusts transition direction of the selected stage signal 241 based on the target transition and the counter module 260. The counter module 260 counts a number of transition edges in the counter trigger signal 251, and sets the done signal 261 to logic "1" when it overflows.

At S440, the speed monitor controller module 270 receives the done signal 261, and generates the speed indicator signal 275 based on the timings of the done signal 261 and a second edge, such as a second rising edge, of the clock signal 282. For example, when the done signal 261 is ahead of the second rising edge, the speed monitor controller module 270 determines that the delay (the time for the number of inversions) is smaller than a clock cycle, for example, and outputs "0" in the speed indicator signal 275. When the done signal 261 follows the second rising edge, the speed monitor controller module 270 determines that the delay (the time for the number of inversions) is larger than a clock cycle, for example, and outputs "1" as the speed indicator signal 275. Then, the process proceeds to S499, and terminates.

According to an embodiment of the disclosure, the counter based speed monitor module 220 can be used for various characterization, debugging, speed-power configuring, and the like. In addition, the counter based speed monitor module 220 can be suitably modified for use in other applications, such as clock generation, synchronization, and the like.

Figure 5:
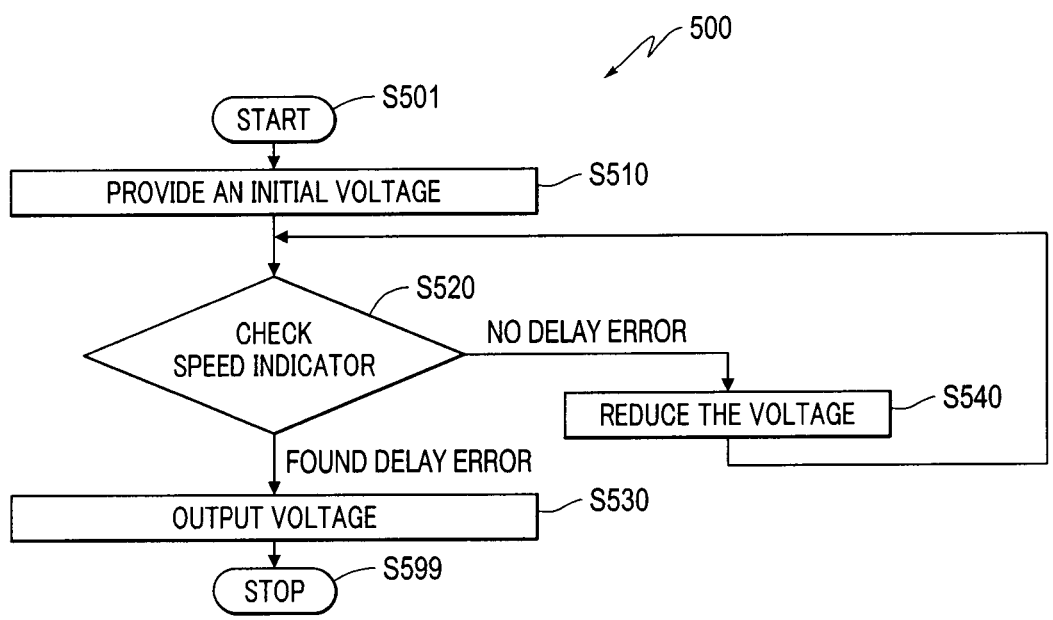
FIG. 5 shows a flowchart outlining a process example 500 for a test controller to characterize a voltage tolerance according to an embodiment of the disclosure.

FIG. 5 shows a flowchart outlining a process example 500 for a test controller to characterize a voltage tolerance using the counter based speed monitor module 220 according to an embodiment of the disclosure. In an example, the test controller is within a tester that applies various tests on an IC chip having the counter based momentary speed monitor module 220. In another example, the test controller is a built-in self-test controller within a same chip as the counter based momentary speed monitor module 220.

In an embodiment, the counter based speed monitor module 220 is placed in a neighborhood of a critical path. The critical path has a delay that is substantially equivalent to a number of inversions. The counter based speed monitor module 220 is configured according to the number of inversions. In an example, a control vector is provided to soft-configure the counter based speed monitor module 220. In another example, the counter based speed monitor module 220 is hard-configured during design process. The process starts at S501, and proceeds to S510.

At S510, the test controller applies an initial voltage to the IC chip for operation. In an example, the initial voltage is a nominal voltage for operation.

At S520, the test controller checks the speed indicator signal 275. Specifically, the test controller controls the counter based speed monitor module 220 to generate the speed indicator signal 275, and then checks the speed indicator signal 275. In an embodiment, the test controller provides a control vector to the counter based speed monitor module 220 to start speed monitoring. Then, the counter based speed monitor module 220 generates the speed indicator signal 275 according to the process 400. In an example, the speed indicator signal 275 is set to logic "1" to indicate a delay error when the delay (the time for the number of inversions) is larger than a clock cycle; and the speed indicator signal 275 is cleared to logic "0" to indicate no delay error when the delay (the time for the number of inversions) is smaller than a clock cycle. When the speed indicator signal 275 indicates a delay error, the process proceeds to S530; otherwise, the process proceeds to S540.

At S530, the test controller outputs a voltage, such as the present voltage applied on the IC chip. The present voltage indicates a maximum voltage that causes a delay error, for example. Then, the process proceeds to S599 and terminates.

At S540, the test controller reduces the applied voltage on the IC chip. Then, the process returns to S520.

It is noted that the process 500 can be suitably adjusted in various aspects. In an example, the initial voltage is a relatively low voltage that causes a delay error, and the test controller increases the applied voltage until no delay error is detected.

Figure 6:
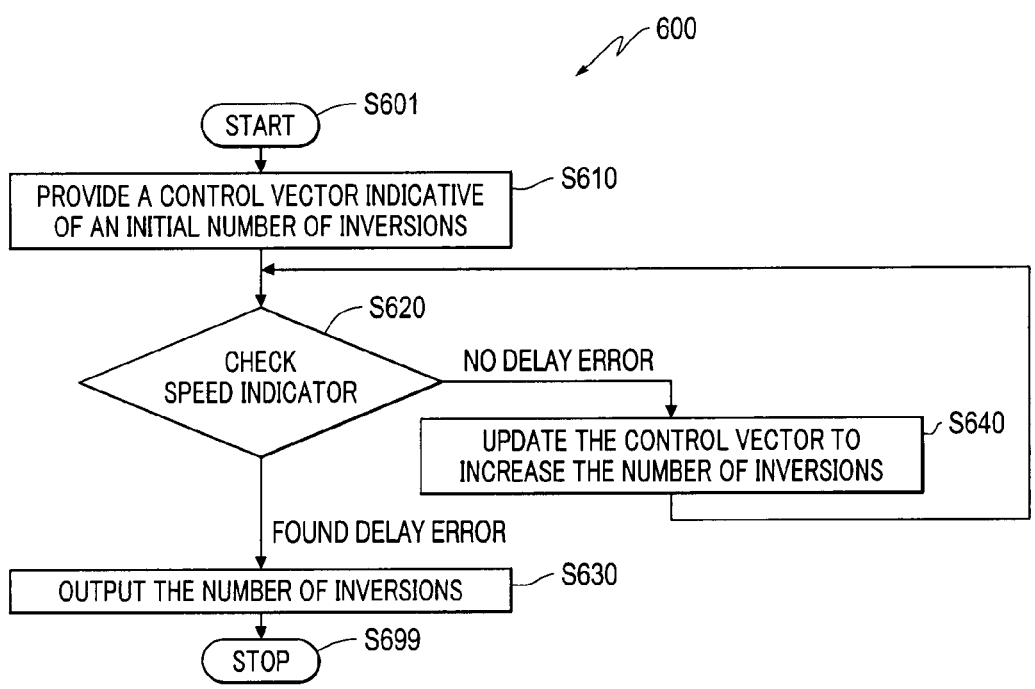
FIG. 6 shows a flowchart outlining a process example 600 for a test controller to detect a delay value according to an embodiment of the disclosure.

FIG. 6 shows a flowchart outlining a process example 600 for a test controller to characterize a delay value according to an embodiment of the disclosure. In an example, the test controller is within a tester that applies various tests on an IC chip having the counter based momentary speed monitor module 220. In another example, the test controller is a built-in self-test controller within a same chip as the counter based momentary speed monitor module 220.

In an example, the counter based speed monitor module 220 is placed at a location of the IC chip to determine variations, such as voltage variation, temperature variation, and the like, at the location. Specifically, the counter based speed monitor module 220 detects speed variations at the location. Further, the speed variations can be decomposed to a quick variation portion, and a slow variation portion, for example. The quick variation portion is due to environmental parameters that change quickly, such as voltage variation. The slow variation portion is due to environmental parameters that change slowly, such temperature variation.

The process 600 starts at S601, and proceeds to S610.

At S610, the test controller provides an initial control vector 281 to the counter based speed monitor module 220. In an example, the initial control vector 281 indicates an initial delay value, such as an initial number of inversions, for monitoring.

At S620, the test controller checks the speed indicator signal 275. Specifically, based on the provided control vector 281, the counter based speed monitor module 220 generates a speed indicator signal, such as the speed indicator signal 275, according to the process 400, for example. In an example, the speed indicator signal 275 is set to logic "1" to indicate a delay error when the delay (the time for the number of inversions) is larger than a clock cycle; and the speed indicator signal 275 is cleared to logic "0" to indicate no delay error when the delay (the time for the number of inversions) is smaller than a clock cycle. When the speed indicator signal indicates a delay error, the process proceeds to S630; otherwise, the process proceeds to S640.

At S630, the test controller outputs the number of inversions. Then, the process proceeds to S699 and terminates.

At S640, the test controller updates the control vector to increase the number of inversions for monitoring, and provides the updated control vector 281 to the counter based speed monitor module 220. Then, the process returns to S620.

It is noted that the process 600 can be suitably adjusted in various aspects. In an example, the initial number of inversions is a relatively large number that can cause a delay error. The test controller decreases the number of inversions until no delay error is detected.

Figure 7:
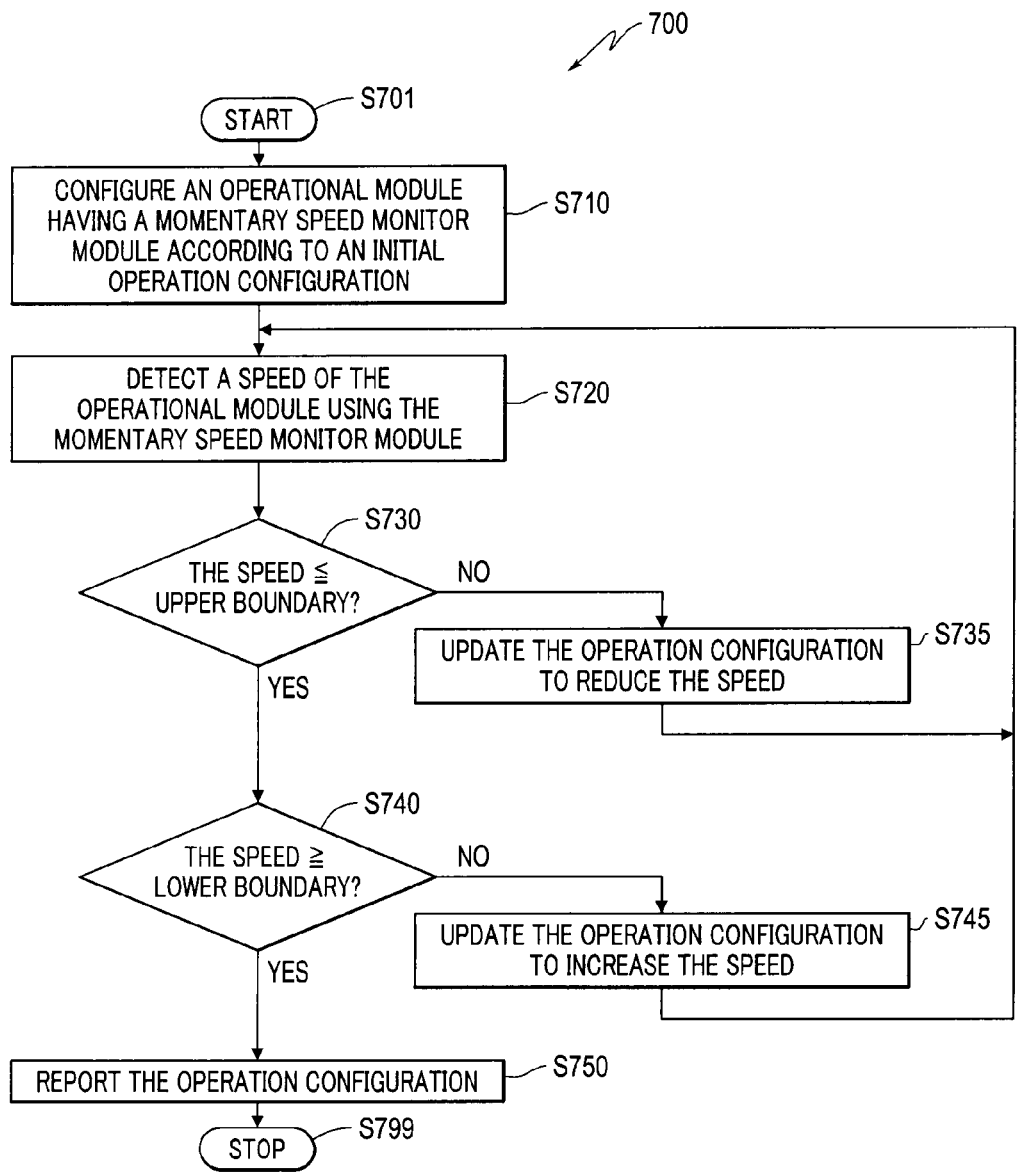
FIG. 7 shows a flowchart outlining a process example 700 for a speed controller to control a speed of an operational module based on a momentary speed monitor module according to an embodiment of the disclosure.

FIG. 7 shows a flowchart outlining a process example 700 for a speed controller to determine a speed-power configuration for an operational module according to an embodiment of the disclosure. The operational module includes a momentary speed monitor module, such as the momentary speed monitor module 220. The momentary speed monitor module 220 is suitably coupled to the operational module, such that the oscillation speed of the ring oscillator module reflects the operation speed of the operational module. The speed controller can be an off-chip speed controller or an on-chip speed controller.

In an embodiment, the operation speed has a lower speed boundary, and an upper speed boundary. The lower speed boundary corresponds to a speed constraint of the operational module. The upper speed boundary corresponds to a power constraint of the operational module. When the operation speed is slower than the lower speed boundary, delay errors can occur in the operational module. When the operation speed is faster than the upper speed boundary, the operational module consumes too much power. In an example, the operational module generates too much heat locally, and may have heat related errors. The speed controller can suitably adjust operation configurations, such as supply voltage, active capacitors of a charge pump, temperature, and the like, to control the operation speed of the operational module to stay between the lower speed boundary and the upper speed boundary.

The process 700 starts at S701 and proceeds to S710.

At S710, the speed controller configures the operational module according to an initial operational configuration.

At S720, the speed controller detects a speed of the operational module using the momentary speed monitor module 220. In an embodiment, the speed controller controls the momentary speed monitor module 220 according to process 600 to obtain a number of inversions that can occur in a clock cycle. The speed of the operation module is represented by a maximum number of inversions that can occur in a clock cycle.

At S730, the speed controller determines whether the speed is lower than the upper speed boundary. When the speed is lower than the upper speed boundary, the process proceeds to S740; otherwise, the process proceeds to S735.

At S735, the speed controller updates the operation configuration to reduce the speed of the operational module. In an embodiment, the speed controller reduces the supply voltage to the operational module. Then, the process returns to S720.

At S740, the speed controller determines whether the speed is higher than the lower speed boundary. When the speed is higher than the lower speed boundary, the process proceeds to S750; otherwise, the process proceeds to S745.

At S745, the speed controller updates the operation configuration to increase the speed of the operational module. In an embodiment, the speed controller increases the supply voltage to the operation module. Then, the process returns to S720.

At S750, the speed controller reports the operation configuration. The operation configuration can be suitably maintained to ensure the operation speed of the operational module is in the appropriate range. Then, the process proceeds to S799, and terminates.

It is noted that the process 700 can be suitably repeated to update the operation configuration.

It is noted that the counter based momentary speed monitor module 220 can be suitably modified for other purpose, such as a high resolution programmable clock generator, a sub-cycle offset determination circuit, and the like.

Figure 8:
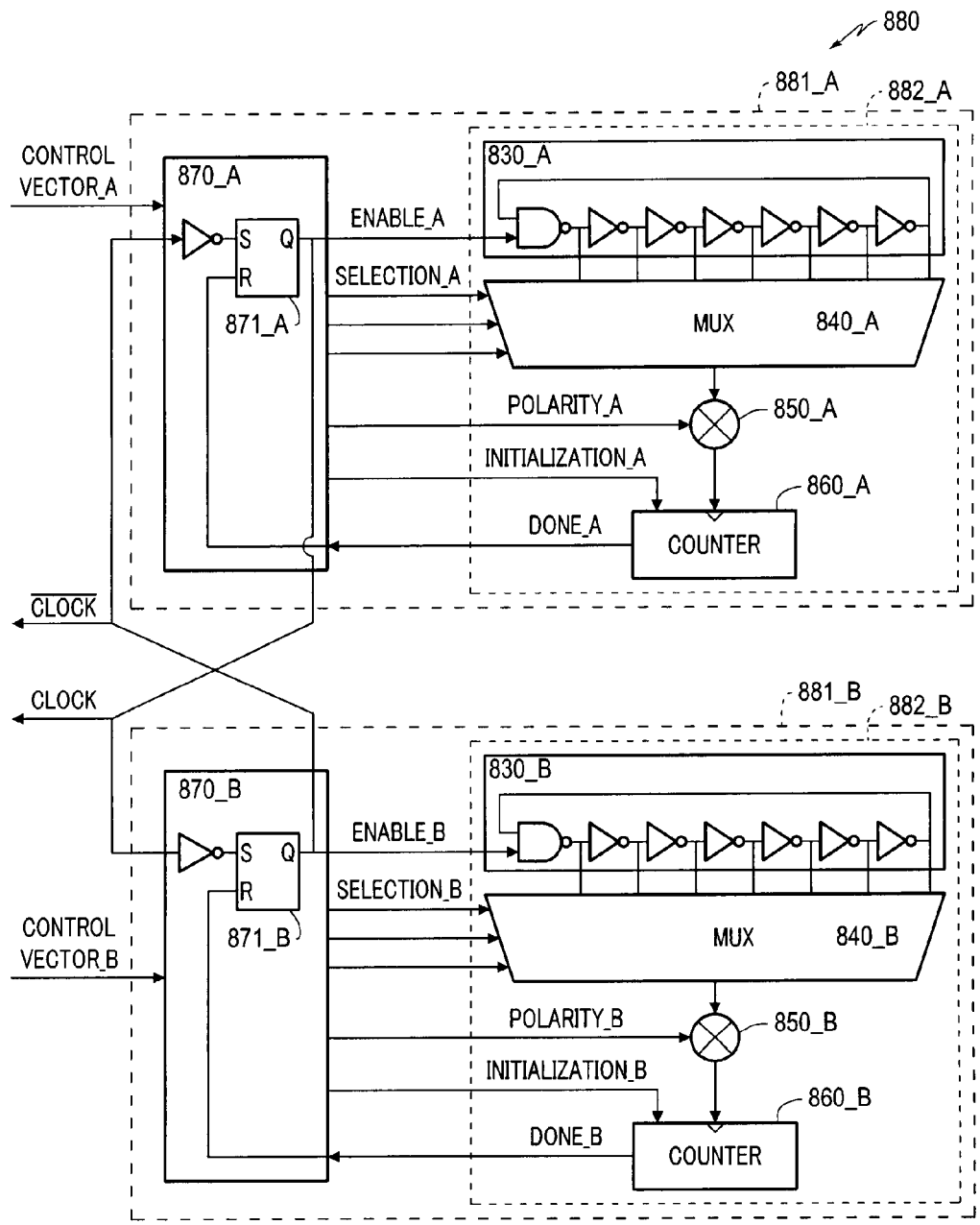
FIG. 8 shows a block diagram of a clock generator circuit example 880 according to an embodiment of the disclosure.

FIG. 8 shows a block diagram of a clock generator circuit example 880 according to an embodiment of the disclosure. The clock generator circuit 880 includes a first pulse generator 881_A and a second pulse generator 881_B cross-coupled together as shown in FIG. 8. The clock generator circuit 880 generates a pair of periodic signals CLOCK and $\overline{\text{CLOCK}}$. In an embodiment, the clock generator circuit 880 is integrated with other circuits on an IC chip, and provides the periodic signal CLOCK as a clock signal to the other circuits. The period of the periodic signals CLOCK and $\overline{\text{CLOCK}}$ is a function of circuit delay time, such as switching delay time, and thus varies with process, voltage, and temperature changes. In addition, the period of the periodic signals CLOCK and $\overline{\text{CLOCK}}$ is programmable, and can be adjustable with a high resolution, such as a single inversion delay, a half inversion delay, and the like.

In the FIG. 8 example, the first pulse generator 881_A includes a controller 870_A and an inversion counter 882_A. Each time when the first pulse generator 881_A is triggered, the first pulse generator 881_A generates a pulse in the periodic signal CLOCK. The pulse has a first pulse width corresponding to a first delay time that is based on a first target number of inversions.

The inversion counter 882_A includes a ring oscillator module 830_A, a multiplexer module 840_A, an XOR module 850_A, and a counter module 860_A. The ring oscillator module 830_A is configured to propagate inversions, and the multiplexer module 840_A, the XOR module 850_A and the counter module 860_A form an edge capture module to capture a target transition edge in the ring oscillator module 830_A. The ring oscillator module 830_A, the multiplexer module 840_A, the XOR module 850_A and the counter module 860_A are similarly configured as the ring oscillator module 230, the multiplexer module 240, the XOR module 250 and the counter module 260; the description of these components has been provided above and will be omitted here for clarity purposes.

The inversion counter 882_A is configured to count inversions propagated in the ring oscillator module 830_A up to the first target number. The first target number is defined by the selection_A signal, the polarity_A signal, and the initialization_A signal. During operation, when the inversion counter 882_A is enabled, the inversion counter 882_A starts counting inversions propagated in the ring oscillator module 830_A. When the counted number of inversions reaches the first target number, the inversion counter 882_A outputs the done_A signal indicative of the first target number being reached.

In an embodiment, the counter module 860_A is reset according to the initialization_A signal by the done_A signal. In another embodiment, the counter module 860_A is reset according to the initialization_A signal in response to other signals, such as a signal (not shown) provided by the controller 870_A.

The controller 870_A includes suitable circuitry to provide the selection_A signal, the polarity_A signal and the initialization_A signal to define the first target number. In an example, the controller 870_A receives a control vector_A that is indicative of the first target number. Then, the controller 870_A provides the selection_A, polarity_A, and the initialization_A signals based on the control vector_A.

In addition, the controller 870_A includes suitable circuitry to generate pulses having the first pulse width. In an example, the first pulse width is about the delay time based on the first target number of inversions.

In the FIG. 8 example, the controller 870_A includes an S-R latch 871_A. During operation, in an example, when the first pulse generator 881_A is not triggered, the output (Q) of the S-R latch 871_A has a relatively low voltage corresponding to logic "0," and disables the inversion counter 882_A.

Further, when the first pulse generator 881_A is triggered, the S-R latch 871_A receives a set signal, for example, the input S switches from logic "0" to logic "1," (e.g., from a relatively low voltage to a relatively high voltage). Then, the output Q of the S-R latch 871_A switches from logic "0" to logic "1", and the periodic signal CLOCK also switches from logic "0" to logic "1" corresponding to a leading edge of a pulse.

When the output Q becomes logic "1," the ring oscillator module 830_A is enabled to start oscillation, and the inversion counter 882_A starts counting inversions propagated in the ring oscillator module 830_A.

When the inversion counter 882_A counts to the first target number, the counter module 860_A generates the done_A signal. In an example, the done_A signal uses a pulse having a relatively small pulse width to indicate that the inversion counter 882_A has counted to the first target number.

The done_A signal resets the S-R latch 871_A, thus the output Q of the S-R latch 871_A switches from logic "1" to logic "0", and the periodic signal CLOCK also switches from logic "1" to logic "0" corresponding to a trailing edge of the pulse. When the output Q becomes logic "0," the ring oscillator module 830_A is disabled. The pulse generated by the first pulse generator 881_A has the first pulse width that is about the delay time of the first target number of inversions in the ring oscillator module 830_A.

The second pulse generator 881_B operates similarly to the first pulse generator 881_A. Each time when the second pulse generator 881_B is triggered, the second pulse generator 881_B generates a pulse in the periodic signal $\overline{\text{CLOCK}}$. The pulse has a second pulse width corresponding to a second delay time that is based on a second target number of inversions.

The second pulse generator 881_B utilizes certain components that are identical or equivalent to those used in the first pulse generator 881_A; the description of these components has been provided above and will be omitted here for clarity purposes.

It is noted that the second target number can be the same as the first target number or can be different from the first target number.

In the FIG. 8 example, the pulse generated by the second pulse generator 881_B has the second pulse width that is about the delay time of the second target number of inversions in the ring oscillator module 830_B. Further, the second pulse width can be the same as the first pulse width or can be different from the first pulse width.

The first pulse generator 881_A and the second pulse generator 881_B are cross-coupled together, such that a trailing edge generated by one of the pulse generators triggers the other pulse generator to start generating a pulse. Thus, the first pulse generator 881_A and the second pulse generator 881_B alternatively generate pulses. The generated pulses form the pair of periodic signals CLOCK and $\overline{\text{CLOCK}}$. In the FIG. 8 example, the period of periodic signals CLOCK and $\overline{\text{CLOCK}}$ is the sum of the first pulse width and the second pulse width.

It is noted that the clock generator circuit 880 can be suitably modified. In an example, an enable circuit is suitably added in the clock generator circuit 880 to enable or disable the clock generator circuit 880 to generate the periodic signals CLOCK and $\overline{\text{CLOCK}}$.

It is noted that the first pulse width and the second pulse width can be adjusted by providing suitable control vector_A and control vector B. In addition, the first pulse width and the second pulse width can be adjusted in the resolution of a single inversion.

According to an aspect of the disclosure, the period of the periodic signals CLOCK and $\overline{\text{CLOCK}}$ is a function of switching delay time, and varies with changes in process, voltage, and temperature. In an embodiment, the periodic signal CLOCK is used as a clock signal in a circuit. In an example, the clock generator circuit 880 is suitably configured that the period of the periodic signal CLOCK is longer than delays of critical paths in the circuit under a nominal case condition. Because the period of the periodic signal CLOCK tracks delay variations due to the supply voltage variation, the temperature variation, the process variation, and the like in the circuit, the period of the periodic signal CLOCK is also longer than the delays of the critical paths in the circuit under worst case conditions. Thus, the period of the periodic signal CLOCK does not need to be overdesigned with margins for the worst case conditions, and the circuit does not need to be tested for the worst case conditions in an example.

According to an embodiment of the disclosure, the clock generator circuit 880 can be used in a globally asynchronous locally synchronous system to generate clock signals. For example, the system includes a plurality of circuit blocks. Each circuit block includes a clock generator circuit 880 to generate a clock signal for the operations of circuits in the circuit block, thus the operations of the circuits in the same circuit block are synchronous. The operations of circuits in different circuit blocks can be asynchronous. The system can use synchronizer circuits as interfaces to enable communications among the circuit blocks.

Figure 9:
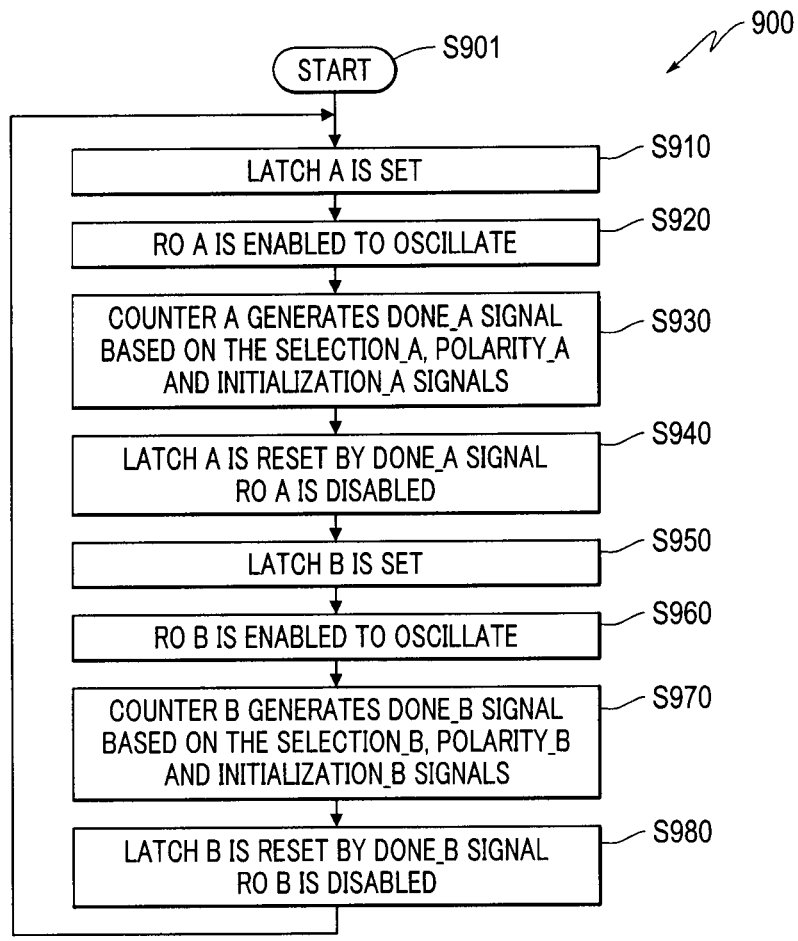
FIG. 9 shows a flowchart outlining a process example 900 for a clock generator to generate a clock signal according to an embodiment of the disclosure.

FIG. 9 shows a flowchart outlining a process example 900 for a clock generator, such as the clock generator 880, to generate a clock signal according to an embodiment of the disclosure. The process starts at S901 and proceeds to S910.

At S910, the first pulse generator 881_A is triggered, and the S-R latch 871_A receives a set signal, for example, the input S switches from logic "0" to logic "1." Then, the output Q of the S-R latch 871_A switches from logic "0" to logic "1", and the periodic signal CLOCK also switches from logic "0" to logic "1" corresponding to a leading edge of a first pulse.

At S920, when the output Q of the S-R latch 871_A becomes logic "1," the ring oscillator module 830_A is enabled to start oscillation, and the inversion counter 882_A starts counting inversions that propagate in the ring oscillator module 830_A.

At S930, when the inversion counter 882_A counts to the first target number that is defined by the selection_A, polarity_A, and initialization_A signals, the counter module 860_A generates the done_A signal. In an example, the done_A signal uses a pulse having a relatively small pulse width to indicate that the inversion counter 882_A has counted to the first target number.

At S940, the done_A signal resets the S-R latch 871_A, thus the output Q of the S-R latch 871_A switches from logic "1" to logic "0", and the periodic signal CLOCK also switches from logic "1" to logic "0" corresponding to a trailing edge of the first pulse. When the output Q of the S-R latch 871_A becomes logic "0," the ring oscillator module 830_A is disabled.

At S950, the trailing edge of the first pulse triggers the second pulse generator 881_B. Specifically, the S-R latch 871_B receives a set signal in response to the trailing edge of the first pulse, for example, the input S of the S-R latch 871_B switches from logic "0" to logic "1." Then, the output Q of the S-R latch 871_B switches from logic "0" to logic "1", and the periodic signal $\overline{CLOCK}$ also switches from logic "0" to logic "1" corresponding to a leading edge of a second pulse.

At S960, when the output Q of the S-R latch 871_B becomes logic "1," the ring oscillator module 830_B is enabled to start oscillation, and the inversion counter 882_B starts counting inversions that propagate in the ring oscillator module 830_B.

At S970, when the inversion counter 882_B counts to the second target number that is defined by the selection_B, polarity_B, and initialization_B signals, the counter module 860_B generates the done_B signal. In an example, the done_B signal uses a pulse having a relatively small pulse width to indicate that the inversion counter 882_B has counted to the second target number.

At S980, the done_B signal resets the S-R latch 871_B, thus the output Q of the S-R latch 871_B switches from logic "1" to logic "0", and the periodic signal $\overline{CLOCK}$ also switches from logic "1" to logic "0" corresponding to a trailing edge of the second pulse. When the output Q of the S-R latch 871_B becomes logic "0," the ring oscillator module 830_B is disabled. The process returns to S910 where the trailing edge of the second pulse triggers the first pulse generator 881_A to generate another first pulse.

Figure 10:
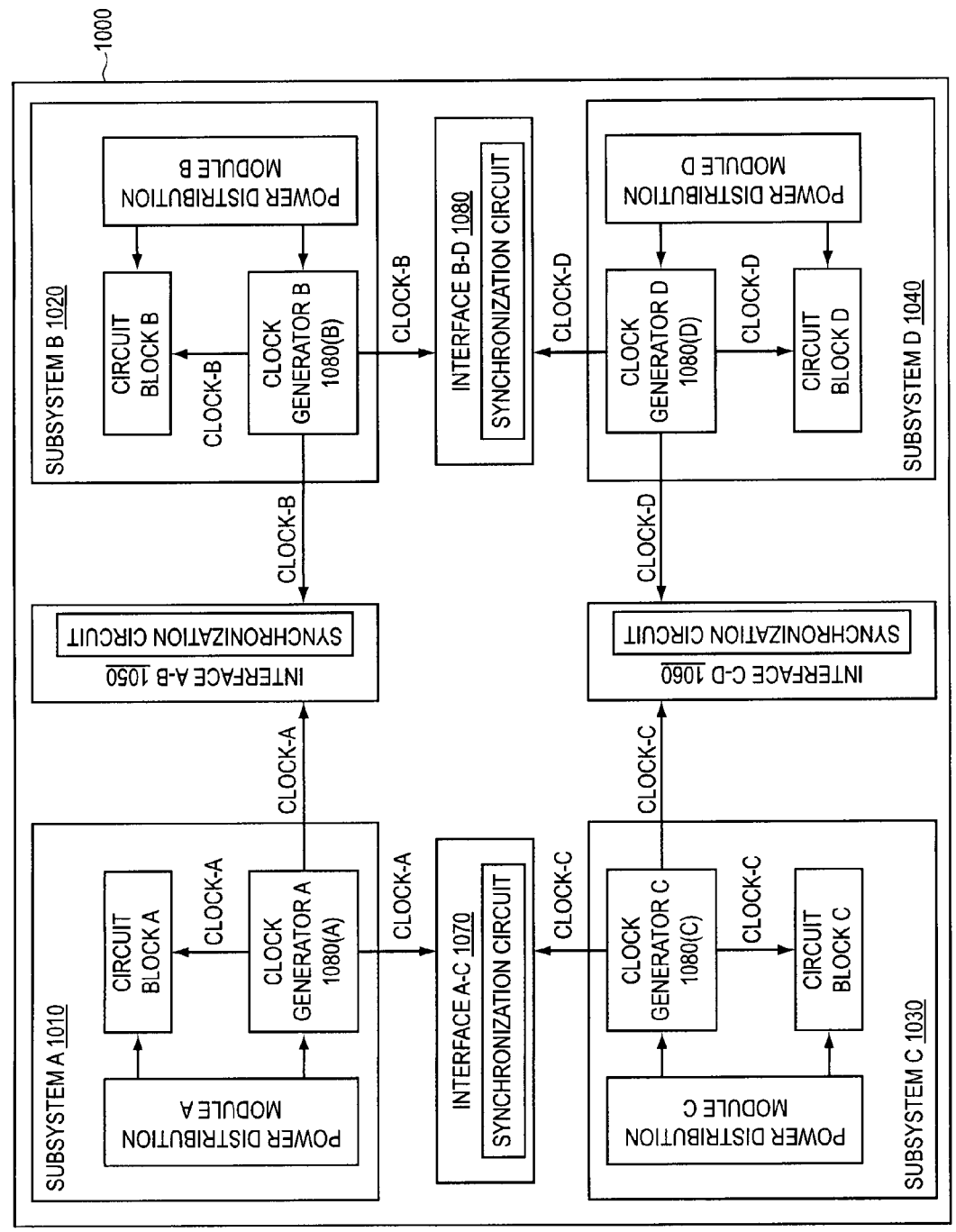
FIG. 10 shows a block diagram of a system example 1000 according to an embodiment of the disclosure.

FIG. 10 shows a block diagram of a system example 1000 according to an embodiment of the disclosure. The system 1000 is a globally asynchronous locally synchronous (GALS) system. The system 1000 includes multiple subsystems, such as a subsystem A 1010, a subsystem B 1020, a subsystem C 1030, and a subsystem D 1040. Each subsystem works in its own clock domain based on a clock signal with a clock cycle that tracks delay variation due to, for example, process, voltage and temperature variations in the subsystem. The clock signals for different subsystems do not need to be synchronized. Further, the system 1000 includes interfaces 1050-1080 to enable communications between subsystems that operate in an asynchronous manner.

Specifically, in the FIG. 10 example, the subsystem A 1010 includes a power distribution module A, a circuit block A and a clock generator A 1080(A); the subsystem B 1020 includes a power distribution module B, a circuit block B and a clock generator B 1080(B); the subsystem C 1030 includes a power distribution module C, a circuit block C and a clock generator C 1080(C); and the subsystem D 1040 includes a power distribution module D, a circuit block D and a clock generator D 1080(D). These elements are coupled together as shown in FIG. 10.

The power distribution module A includes various components for providing power to circuits in the subsystem A 1010. For example, the power distribution module A includes a power input circuit portion to receive an input voltage from a power supply. The power supply can be a system power supply that provides power to the multiple subsystems, or can be an individual power supply that only provides power to the subsystem A 1010.

Further, the power distribution module A includes a voltage regulator circuit configured to regulate the input voltage to generate a regulated voltage. Then, the power distribution module A includes a power grid configured to distribute the regulated voltage to various circuits in the subsystem A, such as the circuit block A and the clock generator A 1080(A). According to an aspect of the disclosure, the power distribution module A provides correlated supply voltages, such as substantially the same supply voltage, to the circuit block A and the clock generator A 1080(A), such that when the supply voltage to the circuit block A has a change, such as a temporary voltage drop, and the like, the supply voltage to the clock generator A 1080(A) has about the same change.

The clock generator A 1080(A) is configured to generate a clock signal CLOCK-A with a clock cycle being a function of switching delay time, such as inversion delay time, and the like. In an example, the clock generator A 1080(A) is configured identically or equivalently to the clock generator 880. The description of the clock generator 880 has been provided above and will be omitted here for clarity purposes. Thus, the clock cycle is a function of the number of inversion delays. The clock cycle is programmable and can be adjusted in the resolution of a single inversion delay, in an embodiment.

The circuit block A can include any suitable circuits, and perform any suitable functions. In an example, the circuit block A is a central processing unit (CPU). In another example, the circuit block A is a portion of a CPU. The circuit block A receives the supply voltage provided by the power distribution module A, and also receives the clock signal CLOCK-A. Further, the circuit block A operates in response to the clock signal CLOCK-A. In other words, circuits in the circuit block A are synchronized in a clock domain based on the clock signal CLOCK-A.

According to an aspect of the disclosure, the circuit block A and the clock generator A 1080(A) are located in an area of a silicon chip that is subject to generally about the same process variation and temperature variation. Further, the power distribution module A distributes about the same supply voltage to the circuit block A and the clock generator A 1080(A). Thus, the switching delay time in the circuit block A and the switching delay time in the clock generator A 1080(A) are closely correlated. When the switching delay time of the circuit block A varies due to, for example, process variation, temperature variation, and the supply voltage variation, the switching delay time of the clock generator A 1080(A) also varies in the same direction. In an example, when the switching delay time of the circuit block A increases momentarily due to a temporary voltage drop in the supply voltage, the inversion delay time of the clock generator A 1080(A) also increases momentarily.

In an embodiment, because the clock cycle of the clock signal CLOCK-A tracks delay variations in the circuit block A due to process variation, temperature variation and/or voltage variation, the clock cycle does not need to be overdesigned and can be determined to locally maximize the speed of the circuit block A. In an example, during a design stage of the subsystem A, the circuit block A is analyzed, for example, based on simulation to determine delays of critical paths under a condition, such as a nominal case condition. Based on the determined critical path delays, a number of inversions for the clock cycle of the clock signal CLOCK-A can be determined, such that the clock cycle is longer than the critical path delays. In an example, a minimum number of inversions for the clock cycle is determined to maximize the speed of the circuit block A. Then the clock generator A 1080(A) is configured or programmed according to the determined number of inversions.

Because the clock cycle of the clock signal CLOCK-A tracks delay variations in the circuit block A due to the supply voltage variation, the temperature variation, and the process variation for example, when the clock cycle is longer than the critical path delays under the nominal case condition, for example, the clock cycle is also longer than the critical path delays of the circuit block A under worst case conditions. Further, in an example, the circuit block A does not need to be tested for the worst case conditions.

In another example, the number of inversions can be determined after chip manufacturing. For example, after chip manufacturing, one of more chips can be tested to determine the number of inversions for the clock generator A 1080(A) to enable the subsystem A to operate correctly under a nominal temperature and a nominal supply voltage. Then, chips can be programmed to enable the clock generator A 1080(A) on the chips to generate the clock signal CLOCK-A according to the determined number of inversions.

The components in the subsystem B 1020, the subsystem C 1030 and the subsystem D 1040 can be similarly or identically configured as the components in the subsystem A 1010; the description of these components has been provided above and will be omitted here for clarity purposes.

According to an embodiment of the disclosure, the clock generator A 1080(A), the clock generator B 1080(B), the clock generator C 1080(C) and the clock generator D 1080 (D) can be respectively configured to generate the clock signals CLOCK-A, CLOCK-B, CLOCK-C, and CLOCK-D in a manner to respectively maximize the speed of the respective subsystems A-D.

Further, according to an embodiment of the disclosure, the interfaces 1050-1080 can enable communications between the subsystems. For example, the interface 1050 includes a synchronization circuit that receives the clock signals CLOCK-A and CLOCK-B to synchronize the two clocks. Then, the interface 1050 can enable signal transmission between the subsystems A and B. The system 1000 can include other interfaces, such an interface between the subsystem A and the subsystem D, and another interface between the subsystem B and the subsystem C.

According to an aspect of the disclosure, the system 1000 can be implemented on an integrated circuit (IC) chip as a system-on-chip. Further, the clock signals CLOCK-A, CLOCK-B, CLOCK-C, and CLOCK-D may or may not have the same frequency. In an embodiment, the power distribution modules A-D form a power grid on the IC chip to distribute the power supply. In an embodiment, the power grid distributes about the same supply voltage over the IC chip. Thus, in an example, the clock signals CLOCK-A, CLOCK-B, CLOCK-C, and CLOCK-D have about the same frequency. It is noted that the clock signals CLOCK-A, CLOCK-B, CLOCK-C, and CLOCK-D may or may not have the same phase. In an example, the system 100 uses a multiple-phase clock. The clock signals CLOCK-A, CLOCK-B, CLOCK-C, and CLOCK-D are generated to have different phases.

According to another aspect of the disclosure, the system 100 is implemented using multiple chips. For example, each subsystem is implemented on a single chip. The interfaces 1050-1080 can be implemented on separate chips or can be implemented on the same chips with the subsystems A-D.

Figure 11:
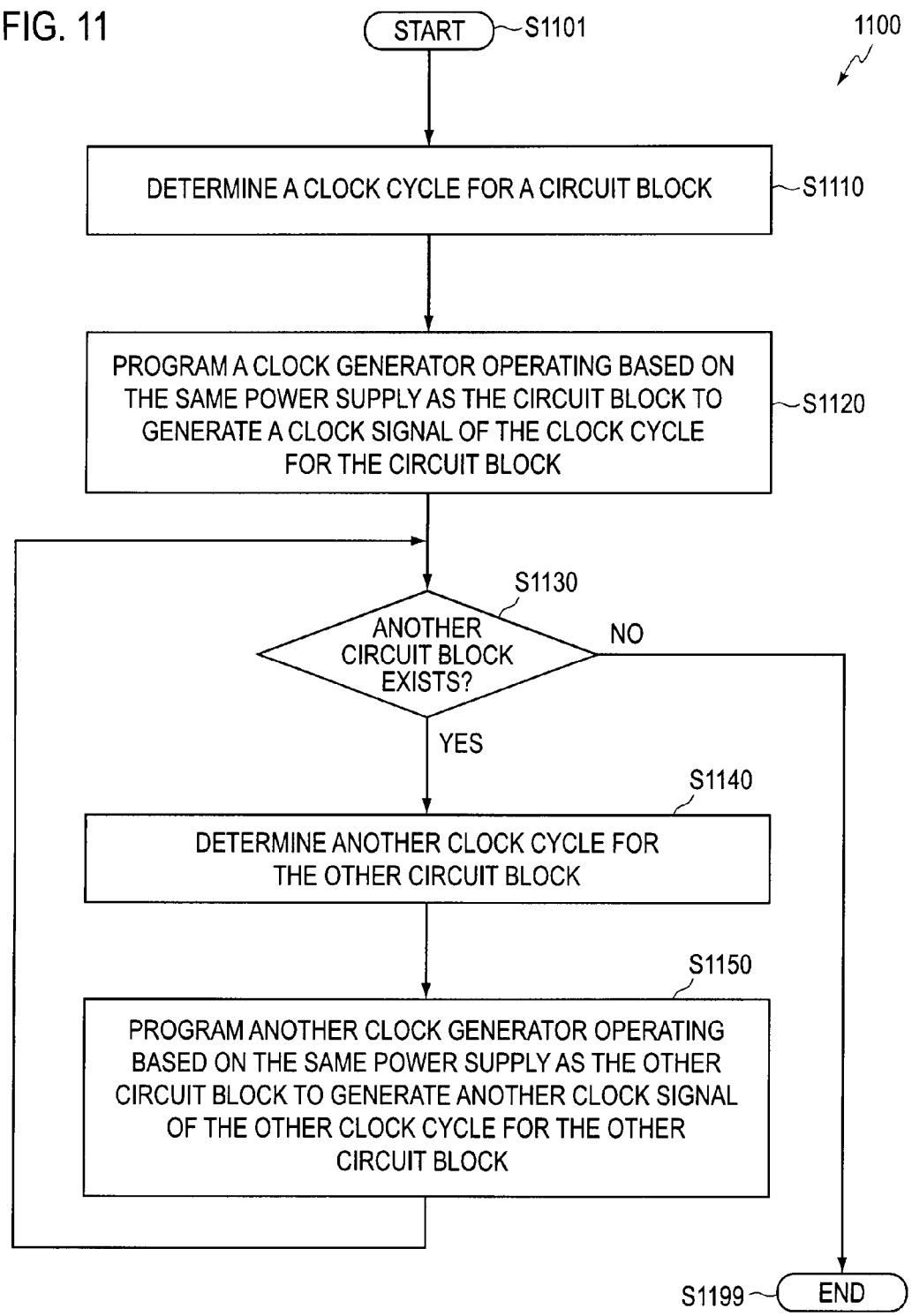
FIG. 11 shows a flowchart outlining a process example 1100 according to an embodiment of the disclosure.

FIG. 11 shows a flowchart outlining a process example 1100 that can be used to configure a GALS system, such as the system 1000, according to an embodiment of the disclosure. The process starts at 51101, and proceeds to S1110.

At S1110, a clock cycle for a circuit block, such as a clock cycle for the circuit block A, is determined. In an example, the clock cycle for the circuit block A is determined based on circuit analysis and simulation. For example, critical paths are extracted based on the circuit analysis and simulation. Then, delays of the critical paths under a condition, such as a nominal case condition, can be determined. Based on the delays of the critical paths, the clock cycle can be determined, for example, to be longer than the delays of the critical paths. In an example, the clock cycle is determined as a number of inversion delays, such as a minimum number of inversion delays that is longer than the delays of the critical paths.

In another example, the clock cycle for the circuit block A is determined based on circuit testing on one or more chips. For example, the clock generator A 1080(A) is programmed to vary the clock cycle of the clock signal CLOCK-A to search a minimum clock cycle that the circuit block A can correctly operate.

At S1120, a clock generator is programmed to generate a clock signal having the clock cycle for the circuit block. The clock generator and the circuit block operate based on substantially the same supply voltage. For example, a non-volatile memory or a one-time programmable memory is used to store the determined number of inversion delays for the clock signal CLOCK-A. Then, when the subsystem A is powered up, the clock generator A 1080(A) is controlled based on the stored number of inversion delays to generate the clock signal CLOCK-A. The clock signal CLOCK-A is provided to the circuit block A. The circuit block A then performs desired functions in response to the clock signal CLOCK-A.

At S1130, when the GALS system has another circuit block whose clock generator has not been programmed, the process proceeds to S1140; otherwise, the process proceeds to S1199 and terminates.

At S1140, another clock cycle for the other circuit block is determined. For example, a clock cycle for the circuit block B is determined. The clock cycle for the circuit block B can be determined using the same techniques as in S1110. The clock cycle for the circuit block B can be determined as a second number of inversion delays.

At S1150, another clock generator is programmed to generate another clock signal of the other clock cycle for the other circuit block. For example, a non-volatile memory or a one-time programmable memory is used to store the second number of inversion delays for the clock signal CLOCK-B. Then, when the subsystem B is powered up, the clock generator B 1080(B) is controlled based on the stored second number of inversion delays to generate the clock signal CLOCK-B. The clock signal CLOCK-B is provided to the circuit block B. The circuit block B then performs desired functions in response to the clock signal CLOCK-B. The process then returns to S1130 to determine whether there is another circuit block whose clock generator has not been programmed.

Figure 12:
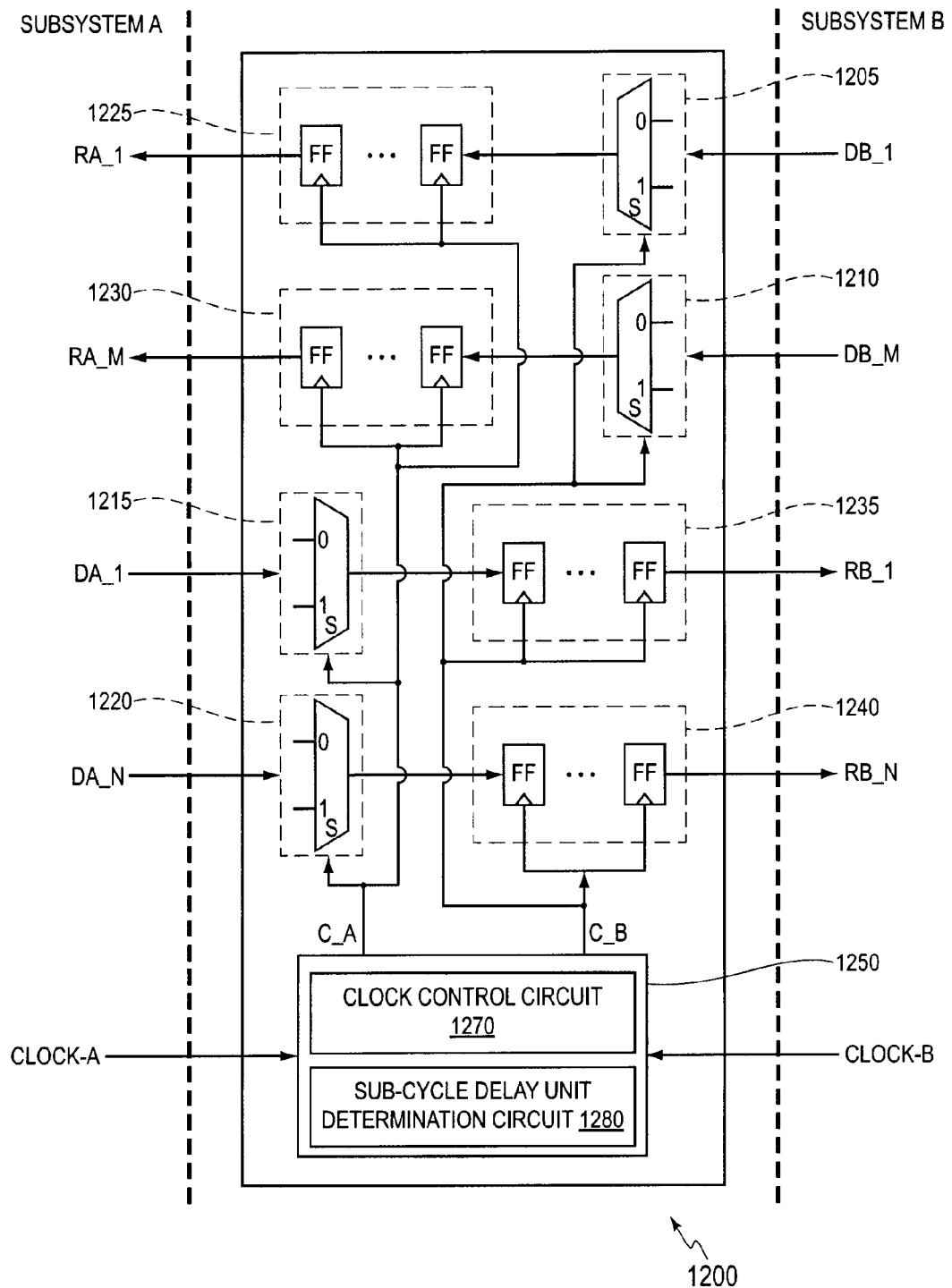
FIG. 12 shows a block diagram of an interface example 1200 according to an embodiment of the disclosure.

FIG. 12 shows a block diagram of an interface example 1200 according to an embodiment of the disclosure. The interface 1200 can be suitably used in the system 1000 as one of the interfaces 1050-1080.

In the FIG. 12 example, the interface 1200 is configured to enable communication between two subsystems, such as a subsystem A and a subsystem B. The two subsystems A and B can operate in different clock domains that are not necessarily synchronized, in an embodiment. For example, the subsystem A operates based on a clock signal CLOCK-A, and the subsystem B operates based on a clock signal CLOCK-B. The clock signals CLOCK-A and CLOCK-B do not need to be related, and can be generated separately, for example, by clock generators configured according to the clock generator circuit 880.

In the FIG. 12 example, the interface 1200 includes a clock synchronization circuit 1250, transmitting circuits 1205-1220, and receiving circuits 1225-1240. The clock synchronization circuit 1250 receives the clock signals CLOCK-A and CLOCK-B, calibrates timing information of the clock signals, and provides interface clocks to the transmitting circuits 1205-1220 and the receiving circuits 1225-1240 to enable communications between the two clock domains. These elements are coupled together as shown in FIG. 12.

The transmitting circuits 1205-1220 transmit signals from one clock domain to the other clock domain. For example, the transmitting circuits 1205-1210 receive signals DB_1 to DB_M from the subsystem B, and suitably transmit those signals to the subsystem A, and the transmitting circuits 1215-1220 receive signals DA_1 to DA_N from the subsystem A, and suitably transmit those signals to the subsystem B. According to an embodiment of the disclosure, each of the transmitting circuits 1205-1220 is configured to synchronize a transition in a signal to an interface clock signal. In an example, each transmitting circuit includes a multiplexer having data inputs (0 and 1) and a select input (S). The transmitting circuit includes logic circuits (not shown) to generate the data inputs based on the signal for transmission, and generate the select input based on the interface clock signal. The transmitting circuit is configured such that the output of the multiplexer has a transition in response to an edge of the interface clock. Thus, the signal transition of the output from the multiplexer is synchronized with the edge of the interface clock.

According to an embodiment of the disclosure, multiple transmitting circuits can use a same interface clock to transmit signals in parallel. For example, the transmitting circuits 1205-1210 are synchronized to a same interface clock, such as an interface clock C_B, to transmit in parallel from the subsystem B to the subsystem A, and the transmitting circuits 1215-1220 are synchronized to a same interface clock, such as an interface clock C_A, to transmit in parallel from the subsystem A to the subsystem B.

The receiving circuits 1225-1240 receive the transmitted signals from one clock domain to the other clock domain. For example, the receiving circuits 1225-1230 respectively receive the transmitted signals by the transmitting circuits 1205-1210, sample the received signals, and provide the sampled signals RA_1 to RA_M to the subsystem A; and the receiving circuits 1235-1240 respectively receive the transmitted signals by the transmitting circuits 1215-1220, sample the received signals, and provide the sampled signals RB_1 to RB-N to the subsystem B.

According to an embodiment of the disclosure, each of the receiving circuits 1225-1240 is configured to sample a transmitted signal in response to edges of a corresponding interface clock. In an example, each receiving circuit includes one or more flip-flops (FFs), such as D flip-flops, that are connected in series to receive the transmitted signal. In the FIG. 12 example, the flip-flops receive an interface clock as clock input and sample the received signal at rising edges of the interface clock. According to an aspect of the disclosure, when the interface clocks C_A and C_B are suitably generated, each receiving circuit can use a single flip-flop to receive the transmitted signal.

According to an embodiment of the disclosure, multiple receiving circuits can receive the transmitted signals in parallel. For example, the receiving circuits 1225-1230 sample the transmitted signals based on a same interface clock, such as the interface clock C_A, and the receiving circuits 1235-1240 sample the transmitted signals based on a same interface clock, such as the interface clock C_B.

The clock synchronization circuit 1250 receives the clock signals CLOCK-A and CLOCK-B from the two clock domains, and determines sub-cycle offset between the two clock signals. It is noted that because the clock signals CLOCK-A and CLOCK-B may not have the same clock cycle, the sub-cycle offset may change cycle by cycle. Further, the synchronization circuit 1250 generates the interface clocks C_A and C_B based on the sub-cycle offset. The interface clocks C_A and C_B are provided to the transmitting circuits 1205-1220 and the receiving circuits 1225-1240 to assist communications between the two clock domains.

According to an aspect of the embodiment, the interface clocks are generated in a manner to avoid sampling transmitted signals at a time when the transmitted signals have transitions, and/or to avoid transmitting transitions in the transmitted signals at a time when the transmitted signals are sampled. In an embodiment, the interface clocks are generated by suitably selecting edges of the clock signals CLOCK-A and CLOCK-B, such as selecting rising edges or failing edges of the clock signals CLOCK-A and CLOCK-B, for transmitting and sampling signals transmitted between the two clock domains, in order to avoid metastable state.

A metastable state can occur when a signal is sampled without respect to setup and hold specification. In an embodiment, a metastable state can occur when a signal is sampled in a time duration that the signal is in transition from a first value, such as corresponding to logic "1", to a second value, such as corresponding to logic "0".

In the FIG. 12 example, a transmitting circuit aligns a transition in a transmitted signal with an edge of an interface clock for transmitting, and a receiving circuit samples the transmitted signal based on an edge of an interface clock for sampling, thus when the edges of the interface clocks for transmitting and sampling are separated by a time duration that is large enough, for example, larger than a threshold, the metastable state can be avoided, and the system does not need to be designed to have a relatively large settling time.

In the FIG. 12 example, the interface clocks are generated by the clock synchronization circuit 1250. The clock synchronization circuit 1250 includes a sub-cycle delay unit determination circuit 1280 and a clock control circuit 1270.

The sub-cycle delay unit determination circuit 1280 calibrates a sub-cycle offset between the clock signals CLOCK-A and CLOCK-B. The calibration can be performed using any suitable techniques. In an example, the sub-cycle delay unit determination circuit 1280 includes an inversion counter having components identical or equivalent to the counter based momentary speed monitor module 220. The description of these components has been provided above and will be omitted here for clarity purposes. Further, the controller of the inversion counter can be suitably modified from the speed monitor controller 270 to measure or search a number of inversion delays corresponding to a time duration, such as a clock cycle, an offset of two clock signals, and the like.

According to an aspect of the disclosure, the clock signals CLOCK-A and CLOCK-B are relatively constant clock signals that the clock cycles are substantially constant. When the clock cycles of the clock signals CLOCK-A and CLOCK-B are determined and a sub-cycle offset is determined at a time, further sub-cycle offset at a different time can be determined by calculations. In an example, the sub-cycle delay unit determination circuit 1280 includes an adder circuit to determine the sub-cycle offset cycle by cycle.

Further, the clock control circuit 1270 selects edges for the interface clocks C_A and C_B based on the sub-cycle offset. In an example, the interface clock C_A is used as a transmitting clock, and the interface clock C_B is used as a sampling clock. The clock control circuit 1270 generates a rising edge of the interface clock C_A in response to a rising edge of the clock signal CLOCK-A for transmitting one or more signals. Then, according to the sub-cycle offset in this cycle, the clock control circuit 1270 selects a rising edge or a falling edge of the clock signal CLOCK-B based on their time distances to the rising edge of interface clock C_A, and generates a rising edge in the interface clock C_B in response to the selected edge for sampling the transmitted signals.

In an example, when the rising edge of the clock signal CLOCK-B is within a safe range away from the rising edge, such as 25% to 75% of the clock cycle of the clock signal CLOCK-A, then the rising edge is selected. When the falling edge of the clock signal CLOCK-B is within 25% to 75% of the clock cycle of the clock signal CLOCK-A, the falling edge is selected. However, when both of the rising edge and the falling edge are not in the safe range, the clock control circuit 1270 can skip a clock cycle of clock signal CLOCK-A, and select an edge of the clock signal CLOCK-B that is in a next clock cycle of the clock signal CLOCK-A. Thus, the sampling edge of the interface clock C_B is safely distanced from the transmitting edge of interface clock C_A to avoid the metastable state.

In an embodiment, the clock control circuit 1270 uses a XOR logic gate to generate an interface clock. In an example, the XOR logic gate receives the clock signal CLOCK-B as a first input, and a control signal as a second input. The XOR logic gate then outputs the interface clock. By changing the control signal, the rising edge of the interface clock can be generated in response to the rising edge or the falling edge of the clock signal CLOCK-B.

It is noted that, in an embodiment, the edges can be generated for communication in both directions. For example, when the edges are suitably generated for signal transmission from the subsystem A to the subsystem B, and then the edges are also suitable for signal transmission from the subsystem B to the subsystem A.

It is also noted that the interface 1200 can include other suitable components. In an example, the interface 1200 includes hardware and/or software for implementing a handshake protocol. The handshake protocol is used to request and acknowledge data from asynchronous domains, and to reduce synchronization latency, for example. In another example, the handshake protocol is not needed.

Figure 13:
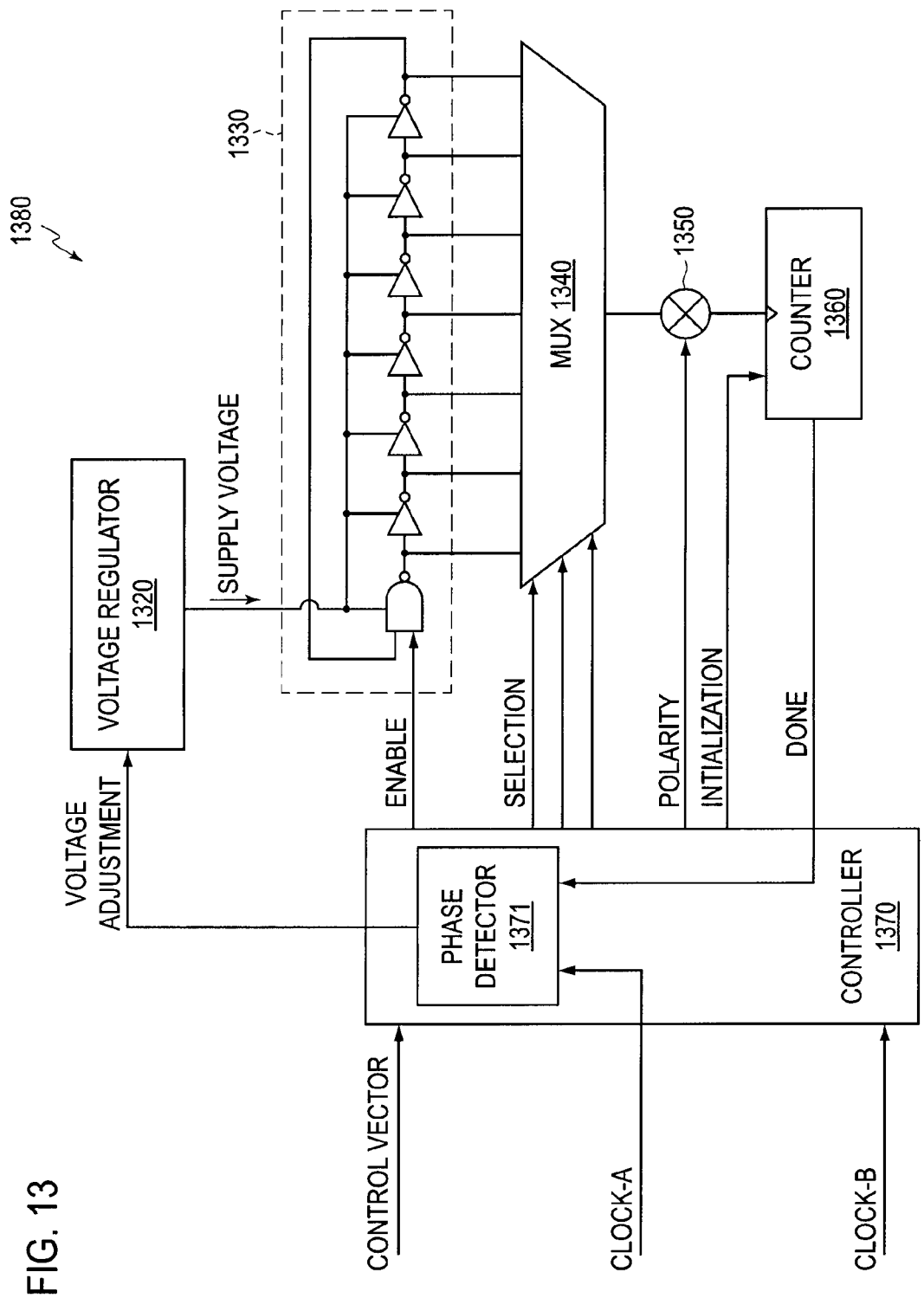
FIG. 13 shows a block diagram of a sub-cycle delay unit determination circuit 1380 according to an embodiment of the disclosure.

FIG. 13 shows a block diagram of a sub-cycle delay unit determination circuit 1380 according to an embodiment of the disclosure. The sub-cycle delay unit determination circuit 1380 includes components identical or equivalent to the counter based momentary speed monitor module 220. The description of these components has been provided above and will be omitted here for clarity purposes.

The sub-cycle delay unit determination circuit 1380 includes a voltage regulator 1320 configured to regulate a supply voltage to the ring oscillator module 1330 based on a voltage adjustment signal. Further, the controller 1370 includes a phase detector 1371 configured to generate the voltage adjustment signal based on a phase difference between a clock signal CLOCK-A and the DONE signal.

According to an aspect of the disclosure, the sub-cycle delay unit determination circuit 1380 is configured to lock an inversion delay with regard to the clock signal CLOCK-A. Then, the sub-cycle delay unit determination circuit 1380 calibrates a number of inversion delays corresponding to the clock cycle of the clock signal CLOCK-B, and a number of inversion delays corresponding to the sub-cycle offset of the clock signals CLOCK-A and CLOCK-B.

In an embodiment, the sub-cycle delay unit determination circuit 1380 can be configured into multiple operation modes, such as a first operation mode to determine the supply voltage to lock the inversion delay with regard to the clock signal CLOCK-A, and a second operation mode to calibrate inversion delays corresponding to one or more time durations.

In an example, in the first operation mode, the enable signal, the selection signal, the polarity signal and the initialization signal are set to enable the DONE signal to be generated every 16 inversion delays. The phase detector 1371, the voltage regulator 1320, the ring oscillator module 1330, the MUX 1340, the XOR module 1350, and the counter 1360 form a loop to determine the supply voltage in order to lock the inversion delay with regard to the clock signal CLOCK-A. When the sub-cycle delay unit determination circuit 1380 is locked with regard to the clock signal CLOCK-A, the clock cycle of the clock signal CLOCK-A corresponds to 16 inversion delays.

Then, the voltage regulator 1320 fixes the supply voltage at the determined level that locks the inversion delay with regard to the clock signal CLOCK-A, and the sub-cycle delay unit determination circuit 1380 enters the second operation mode. In the second operation mode, the sub-cycle delay unit determination circuit 1380 searches suitable settings for the enable signal, the selection signal, the polarity signal, and the initialization signal to determine the number of inversion delays corresponding to a time duration, such as a clock cycle of the clock signal CLOCK-B, and a sub-cycle offset between the clock signals CLOCK-A and CLOCK-B at a time.

Figure 14:
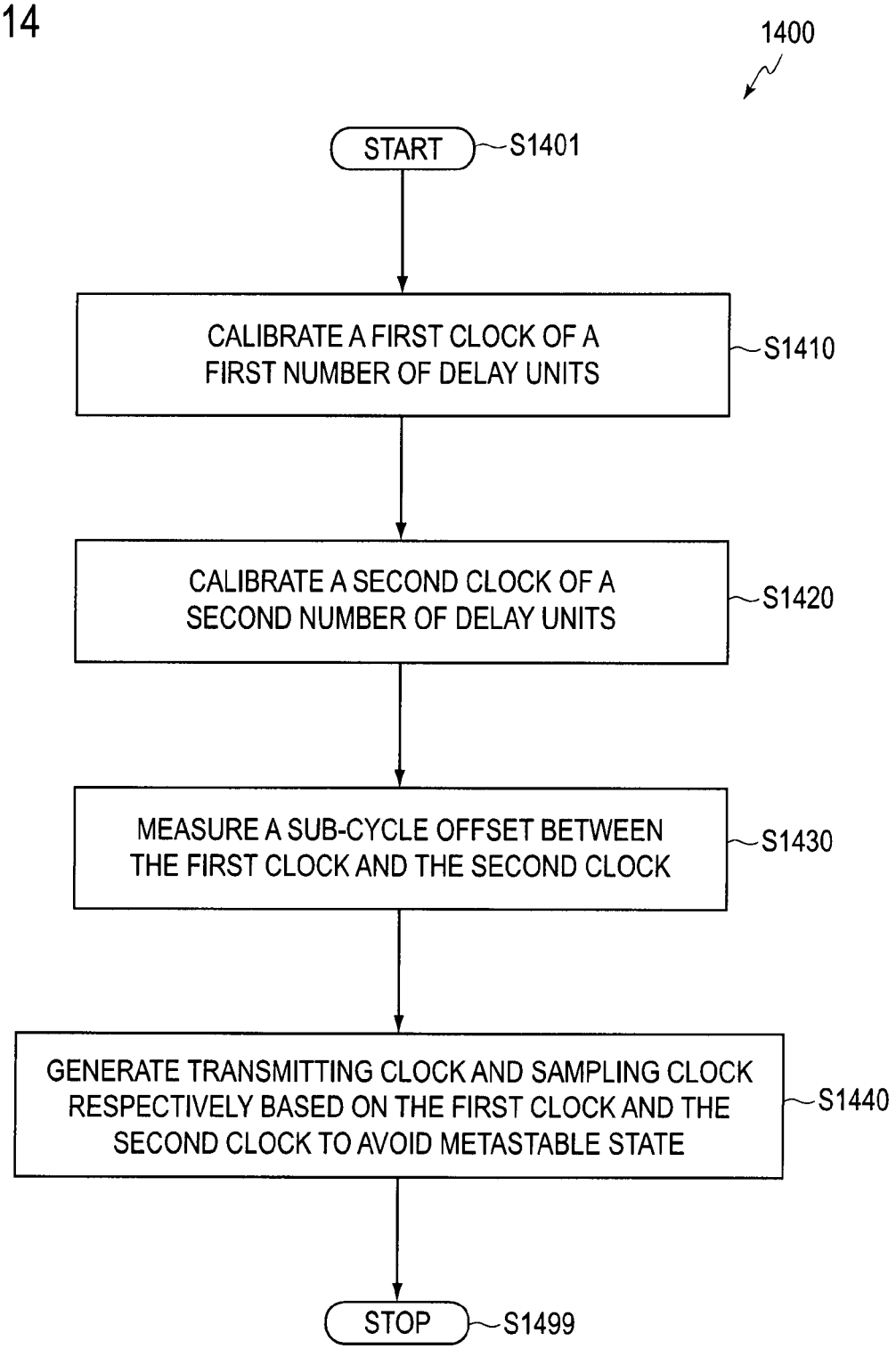
FIG. 14 shows a flowchart outlining a process example 1400 according to an embodiment of the disclosure.

FIG. 14 shows a flowchart outlining a process example 1400 according to an embodiment of the disclosure. The process 1400 is executed by a clock synchronization circuit, such as the clock synchronization circuit 1250, to generate interface clocks for an interface to avoid metastable state for signal communication between asynchronous clock domains. In an example, a GALS system, such as the system 1000, includes a first clock domain, such as the subsystem A 1010 with circuits synchronized based on a first clock, and a second clock domain, such as the subsystem B 1020, with circuits synchronized based on a second clock that may not be related to the first clock. The process starts at S1401, and proceeds to S1410.

At S1410, the first clock is calibrated of a first number of delay units. In an example, a free-running inversion counter is used to determine a first number of inversion delays corresponding to the clock cycle of the first clock. In another example, the sub-cycle delay unit determination circuit 1380 is used to lock a first number of inversion delays with regard to the first clock.

At S1420, the second clock is calibrated of a second number of delay units. In an example, the free-running inversion counter is used again to determine a second number of inversion delays corresponding to the clock cycle of the second clock. In another example, the sub-cycle delay unit determination circuit 1380 is used after being locked to determine the second number of inversion delays corresponding to the clock cycle of the second clock.

At S1430, a sub-cycle offset in a cycle between the first clock and the second clock is measured at a time. Then, based on the sub-cycle offset, the first number of delay units and the second number of delay units, sub-cycle offsets at different time, such as in further clock cycles, can be determined.

At S1440, interface clocks, such as transmitting clock and sampling clock, for the interface are generated respectively based on the first clock and the second clock. In an example, an edge in the transmitting clock is generated in response to a rising edge of the first clock. When a rising edge of the second clock is within 25% to 75% of the clock cycle of the first clock from the rising edge, then an edge in the sampling clock can be generated in response to the rising edge of the second clock. When a falling edge of the second clock is within 25% to 75% of the clock cycle of the first clock, then an edge in the sampling clock can be generated in response to the failing edge of the second clock. However, when both of the rising edge and the falling edge of the second clock are not in the 25% to 75% range of the clock cycle of the first clock, a clock cycle can be skipped, and an edge in the sampling clock can be generated in response to an edge of the second clock in a next clock cycle of the first clock. Thus, the edge in the transmitting clock and the edge in the sampling clock are safely distanced to avoid the metastable state. The process then proceeds to S1499 and terminates.

Figure 15:
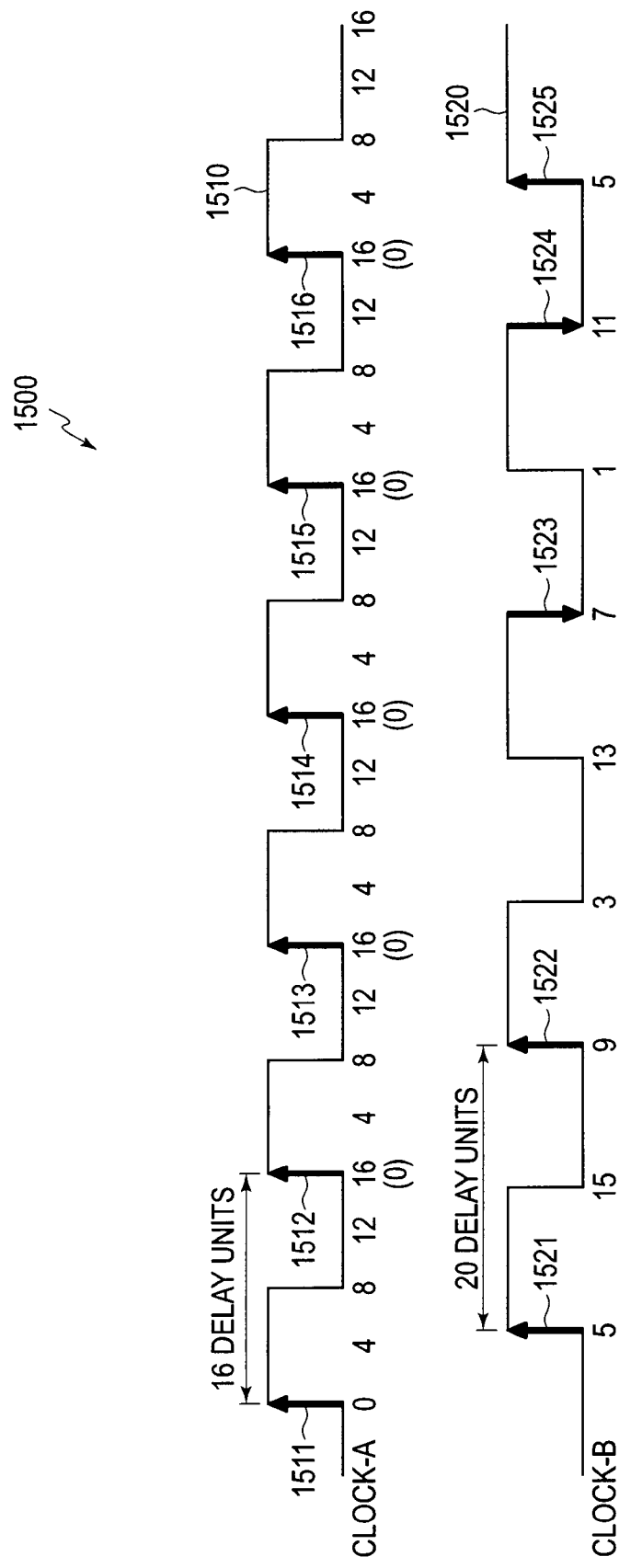
FIG. 15 shows a plot 1500 of clock waveforms according to an embodiment of the disclosure.

FIG. 15 shows a plot 1500 of clock waveforms according to an embodiment of the disclosure. The plot 1500 includes a first waveform for a first clock signal CLOCK-A and a second waveform for a second clock signal CLOCK-B. The first clock signal CLOCK-A is calibrated to have a clock cycle of 16 delay units, such as 16 inversion delays. The second clock signal CLOCK-B is calibrated to have a clock cycle of 20 delay units, such as 20 inversion delays.

In an example, an edge in a transmitting clock is generated in response to an edge 1511. Because the sub-cycle offset between the two clock signals is 5 delay units in this cycle, which is in the 25% to 75% range of the clock cycle of the first clock signal, then an edge in a sampling clock can be generated in response to an edge 1521.

Similarly, when an edge in the transmitting clock is generated in response to an edge 1512, then an edge in the sampling clock can be generated in response to an edge 1522.

However, when an edge in the transmitting clock is generated in response to an edge 1513, because both the rising edge and the falling edge of the second clock signal are out of the 25% to 75% clock cycle range of the first clock signal, a clock cycle is skipped. Then, an edge in the sampling clock can be generated in response to an edge 1523 which is a falling edge in the FIG. 15 example.

In an embodiment, a 4-bit adder is used to determine sub-cycle offset of the second clock signal in a cycle of the first clock signal. For example, the 4-bit adder has a value of 5 in a first cycle, and the 4-bit adder adds 20 in a second cycle, then the value of the 4-bit adder becomes 9 when the carry is ignored. Then, in third cycle, the 4-bit adder adds another 20, then the value of the 4-bit adder becomes 13 when the carry is ignored. Further, when the value of the 4-bit adder is in the range of 4 to 12, the rising edge of the second clock signal can be selected to generate the sampling clock. The falling edge can be calculated by adding 10 in the 4-bit adder. Similarly, when the failing edge is offset in the range of 4 to 12, the falling edge of the second clock signal can be selected to generate the sampling clock. When both of the rising edge and falling edge of the second clock signal are not in the range of 4 to 12, a clock cycle can be skipped, and an edge of the second clock signal in a next cycle can be selected to generate the sampling clock.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
 a clock synchronization circuit configured to determine a sub-cycle offset between a first clock signal and a second clock signal, and select rising/failing edges of the first clock signal and the second clock signal based on the sub-cycle offset for enabling bi-directional communication between a first clock domain that is operative in response to the first clock signal and a second clock domain that is operative in response to the second clock signal, wherein the clock synchronization circuit comprises:
 a sub-cycle offset determination circuit configured to determine an offset in a cycle between the first clock signal and the second clock signal as a number of delay units; and
 a clock control circuit configured to select the edges of the first clock signal and the second clock signal based on the determined offset.

2. The circuit of claim 1, wherein the sub-cycle offset determination circuit is configured to determine a first number of delay units corresponding to a first clock cycle of the first clock signal, a second number of delay units corresponding to a second clock cycle of the second clock signal, and a third number of delay units corresponding to the offset in a cycle between the first clock signal and the second clock signal.

3. The circuit of claim 1, wherein the sub-cycle offset determination circuit further comprises:
an inversion counter configured to determine a number of inversion delays in a time duration.

4. The circuit of claim 3, wherein the inversion counter comprises:
a ring oscillator configured to propagate a signal through a plurality of inversion stages that forms the ring oscillator;
a controller configured to determine the number of inversion stages that the signal propagates in the time duration.

5. The circuit of claim 4, wherein the ring oscillator is locked to one of the first clock signal and the second clock signal to propagate a pre-determined number of inversion stages during a clock cycle.

6. The circuit of claim 1, further comprising:
a transmitting circuit configured to transmit a signal from the first clock domain to the second clock domain according a first interface clock generated based on the first clock signal; and
a receiving circuit configured to sample the signal transmitted from the first clock domain according a second interface clock generated based on the second clock signal.

7. A method, comprising:
determining a sub-cycle offset between a first clock signal and a second clock signal that are not synchronized by determining an offset in a cycle between the first clock signal and the second clock signal as a number of delay units; and
selecting rising/failing edges of the first clock signal and the second clock signal based on the sub-cycle offset for enabling bi-directional communication between a first clock domain that is synchronized based on the first clock signal and a second clock domain that is synchronized based on the second clock signal.

8. The method of claim 7, further comprising:
determining a first number of delay units corresponding to a first clock cycle of the first clock signal;
determining a second number of delay units corresponding to a second clock cycle of the second clock signal; and
determining a third number of delay units corresponding to the offset between the first clock signal and the second clock signal.

9. The method of claim 7, wherein determining the offset in the cycle between the first clock signal and the second clock signal as the number of delay units further comprises:
determining a number of inversion delays in a time duration.

10. The method of claim 9, wherein determining the number of inversion delays in the time duration further comprises:
propagating a signal through a plurality of inversion stages that forms a ring oscillator;
determining the number of inversion stages that the signal propagates in the time duration.

11. The method of claim 10, further comprising:
locking the ring oscillator to one of the first clock signal and the second clock signal to propagate a pre-determined number of inversion stages during a clock cycle.

12. The method of claim 7, further comprising:
transmitting a signal from the first clock domain to the second clock domain according to a first interface clock generated based on the first clock signal; and
sampling the data from the first clock domain to the second clock domain according to a second interface clock generated based on the second clock signal.

13. A system, comprising:
a first subsystem configured to be operative in response to a first clock signal;
a second subsystem configured to be operative in response to a second clock signal that is not synchronized to the first clock signal;
a clock synchronization circuit configured to determine a sub-cycle offset between the first clock signal and the second clock signal, and select rising/failing edges of the first clock signal and the second clock signal based on the sub-cycle offset for enabling bi-directional communication between the first subsystem and the second subsystem, wherein the clock synchronization circuit includes a sub-cycle offset determination circuit configured to determine an offset in a cycle between the first clock signal and the second clock signal as a number of delay units, and a clock control circuit configured to select the edges of the first clock) signal and the second clock signal based on the offset.

14. The system of claim 13, wherein the sub-cycle offset determination circuit is configured to determine a first number of delay units corresponding to a first clock cycle of the first clock signal, a second number of delay units corresponding to a second clock cycle of the second clock signal, and a third number of delay units corresponding to the sub-cycle offset between the first clock signal and the second clock signal.

15. The system of claim 13, wherein the sub-cycle offset determination circuit further comprises:
an inversion counter configured to determine a number of inversion delays in time duration.

16. The system of claim 15, wherein the inversion counter comprises:
a ring oscillator configured to propagate a signal through a plurality of inversion stages that forms the ring oscillator;
a controller configured to determine the number of inversion stages that the signal propagates in the time duration.

17. The system of claim 16, wherein the ring oscillator is locked to one of the first clock signal and the second clock signal to propagate a pre-determined number of inversion stages during a clock cycle.

* * * * *